(12) United States Patent
Kim

(10) Patent No.: US 11,029,888 B2
(45) Date of Patent: Jun. 8, 2021

(54) MEMORY SYSTEM AND METHOD OF CONTROLLING OPERATIONS ON BAD MEMORY BLOCK BASED ON TEMPERATURE

(71) Applicant: SK hynix Inc., Gyeonggi-do (KR)

(72) Inventor: Byung-Jun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/722,856

(22) Filed: Dec. 20, 2019

(65) Prior Publication Data

US 2020/0348887 A1 Nov. 5, 2020

(30) Foreign Application Priority Data

Apr. 30, 2019 (KR) .................. 10-2019-0050297

(51) Int. Cl.
*G06F 3/06* (2006.01)
*G11C 16/04* (2006.01)
*G01K 13/00* (2021.01)
*G11C 16/30* (2006.01)
*G11C 16/08* (2006.01)

(52) U.S. Cl.
CPC .......... *G06F 3/0659* (2013.01); *G01K 13/00* (2013.01); *G06F 3/0619* (2013.01); *G06F 3/0653* (2013.01); *G06F 3/0673* (2013.01); *G11C 16/0483* (2013.01); *G11C 16/08* (2013.01); *G11C 16/30* (2013.01)

(58) Field of Classification Search
CPC .... G06F 3/0659; G06F 3/0619; G06F 3/0673; G06F 3/0653; G11C 16/0483; G11C 16/08; G11C 16/30; G01K 13/00
See application file for complete search history.

(56) References Cited

U.S. PATENT DOCUMENTS

| | | | |
|---|---|---|---|
| 8,873,323 B2* | 10/2014 | Li ................ | G06F 12/0246 365/211 |
| 9,524,132 B2* | 12/2016 | Weaver .......... | G03G 15/5079 |
| 10,782,920 B2* | 9/2020 | Yeh ................ | G11C 16/16 |
| 2008/0141076 A1* | 6/2008 | Hu ................. | G06F 11/00 714/45 |
| 2017/0271031 A1* | 9/2017 | Sharon ........... | G06F 11/3058 |
| 2018/0067678 A1* | 3/2018 | Jeong ............. | G06F 3/0634 |

FOREIGN PATENT DOCUMENTS

| | | |
|---|---|---|
| KR | 10-2008-0071366 | 8/2008 |
| KR | 10-2016-0113580 | 9/2016 |
| KR | 10-2018-0026993 | 3/2018 |

\* cited by examiner

*Primary Examiner* — Sultana Begum
(74) *Attorney, Agent, or Firm* — IP & T Group LLP

(57) ABSTRACT

A memory system may include a memory device comprising a plurality of memory blocks and a controller suitable for controlling an operation of the memory device. The controller may perform a fake operation on a predetermined memory block not used to store data when a temperature of the memory device is in a low temperature range.

20 Claims, 14 Drawing Sheets

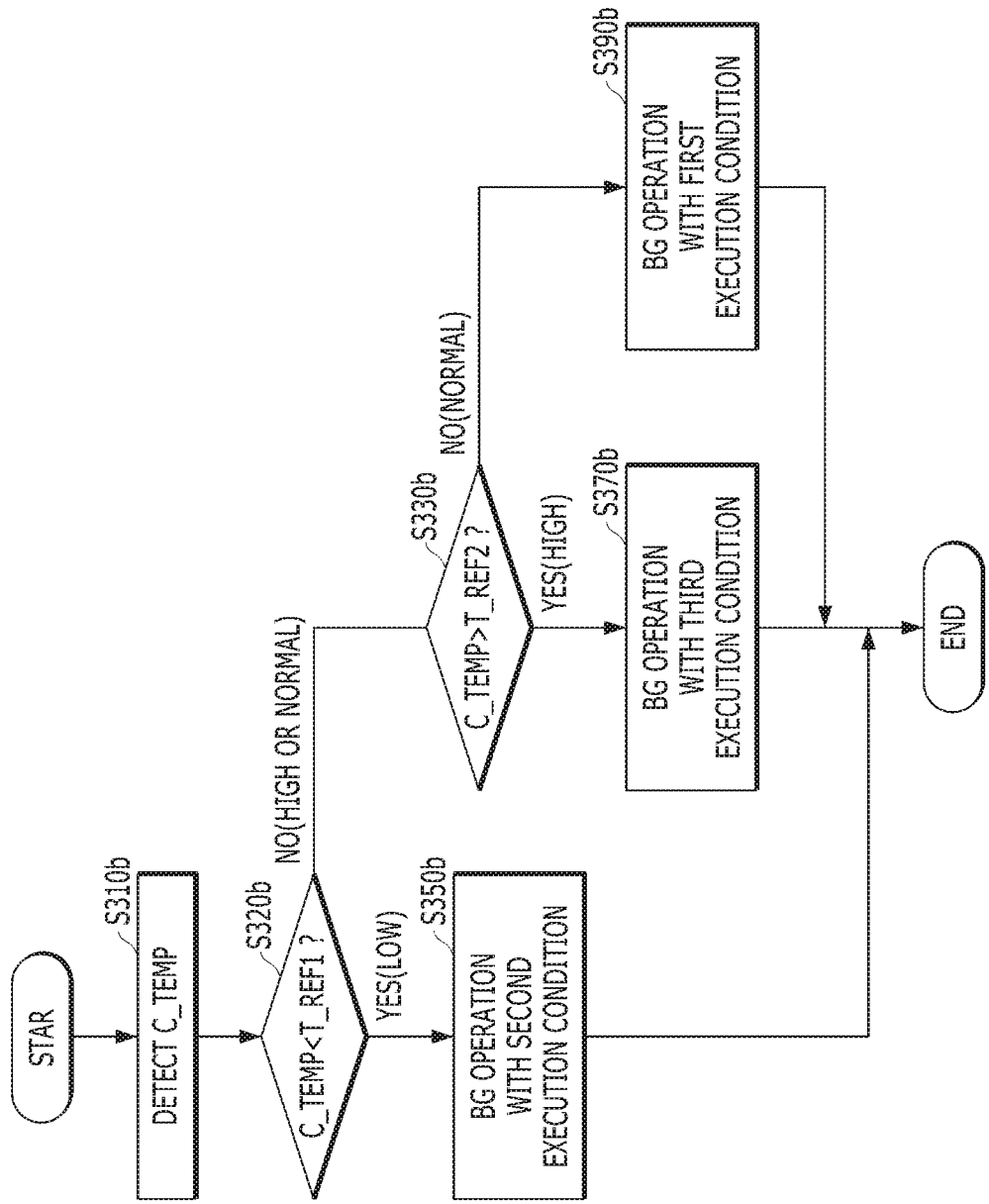

MEMORY SYSTEM AND METHOD OF CONTROLLING OPERATIONS ON BAD MEMORY BLOCK BASED ON TEMPERATURE

CROSS-REFERENCE TO RELATED APPLICATION

This patent application claims priority under 35 U.S.C. § 119(a) to Korean Patent Application No. 10-2019-0050297, filed on Apr. 30, 2019, which is incorporated herein by reference in its entirety.

BACKGROUND

1. Field

Various embodiments relate to a memory system including a memory device and a controller, and more particularly, to a memory system and a method of controlling the temperature of the memory system.

2. Discussion of the Related Art

Recently, the paradigm for a computing environment has shifted to ubiquitous computing, which enables computer systems to be accessed anytime and anywhere. As a result, the use of portable electronic devices, such as mobile phones, digital cameras, notebook computers and the like, is rapidly increasing. Such portable electronic devices typically use or include a memory system that uses or embeds at least one memory device, i.e., a data storage device. The data storage device can be used as a main storage device or an auxiliary storage device of a portable electronic device.

Unlike a hard disk, a data storage device using a nonvolatile semiconductor memory device is advantageous in that it has excellent stability and durability because it has no mechanical driving part (e.g., a mechanical arm), has high data access speed, and low power consumption. In the context of a memory system having such advantages, an exemplary data storage device includes a USB (Universal Serial Bus) memory device, a memory card having various interfaces, a solid state drive (SSD) or the like.

SUMMARY

Various embodiments are directed to a memory system and a method of driving the same, which can increase data reliability by differently setting an execution condition for an internal operation based on a detected temperature of a memory device and controlling the execution of an internal operation including a background operation or a fake operation having less influence on data safety according to the set execution condition.

Various embodiments are directed to the provision of an apparatus or method, which can maintain the lifespan of a memory system or improve data safety or device safety in such a manner that a memory system determines whether to perform an internal operation according to an operation environment.

In accordance with an embodiment of the present invention, a memory system may include a memory system may comprise: a memory device may comprise a plurality of memory blocks; and a controller suitable for controlling an operation of the memory device, wherein the controller may perform a fake operation on a set memory block not used to store data when a temperature of the memory device is in a low temperature range. The fake operation may comprise a program operation, an erase operation or a read operation. The memory system may further comprise a temperature sensor suitable for detecting the temperature of the memory device. The set memory block may comprise a bad block or a spare memory block. The controller may perform a background operation according to an execution condition for the background operation based on the temperature of the memory device. The background operation may comprise at least one of a garbage collection, wear leveling and a read reclaim. The execution condition for the background operation may comprise an execution time, a number of execution targets in the set memory block and an execution period. The controller may perform a first background operation according to a first execution condition when the temperature is in a normal temperature range, may perform a second background operation according to a second execution condition when the temperature is in the low temperature range, and may perform a third background operation according to a third execution condition when the temperature is in a high temperature range. The second execution condition may have more execution targets and a shorter execution period than the first execution condition. The third execution condition may have fewer execution targets and a longer execution period than the first execution condition.

In accordance with an embodiment of the present invention, a method of controlling a temperature, by a memory system, the memory system may comprise a memory device including a plurality of memory blocks and a controller suitable for controlling the memory device, and the method may comprise: detecting a temperature of the memory device; and performing a fake operation on a set memory block not used to store data when the detected temperature of the memory device is in a low temperature range. The fake operation may comprise a program operation, an erase operation or a read operation. The set memory block may comprise a bad block or a spare memory block. The method may further comprise performing a background operation according to an execution condition for the background operation performed on a memory block based on the detected temperature. The performing of the background operation is performed prior to the performing of the fake operation. The performing of the background operation is performed after the performing of the fake operation. The background operation may comprise at least one of a garbage collection, wear leveling and a read reclaim. The execution condition may comprise an execution time, a number of execution targets in the set memory block and an execution period. The method may further comprise: performing a first background operation according to a first execution condition when the temperature is in a normal temperature range; performing a second background operation according to a second execution condition when the temperature is in the low temperature range; and performing a background operation according to a third execution condition when the temperature is in a high temperature range. The second execution condition may have more execution targets and a longer execution time than the first execution condition, and the third execution condition may have fewer execution targets and a shorter execution time than the first execution condition.

In accordance with an embodiment of the present invention, a method of controlling temperature in a memory system may comprise a memory device including a memory block and a controller suitable for controlling the memory device, the method may comprise: detecting a temperature of the memory device; performing an internal operation on the memory block in accordance with the temperature and an execution condition, wherein the execution condition changes based on the temperature. The execution condition for the internal operation may comprise at least one of an execution time, a number of execution targets in the memory block and an execution period. The performing of the internal operation may comprise: performing an internal operation according to a first condition when the detected temperature is in a normal temperature range; performing an internal operation according to a second condition when the detected temperature is in a low temperature range; or performing an internal operation according to a third condition when the detected temperature is in a high temperature range. A frequency at which the internal operation is performed according to the second condition is higher than a frequency at which the internal operation is performed according to the first condition, and an execution time according to the second condition is longer than an execution time according to the first condition. A frequency at which the internal operation is performed according to the third condition is lower than the frequency at which the internal operation is performed according to the first condition, and an execution time according to the third condition is shorter than an execution time according to the first condition. An amount of heat generated in the internal operation according to the second condition is greater than an amount of heat generated in the internal operation according to the first condition. An amount of heat generated in the internal operation according to the third condition is less than an amount of heat generated in the internal operation according to the first condition. The internal operation is a background operation may comprise at least one of a garbage collection, wear leveling and a read reclaim. The method may further comprise; performing a fake operation on a set memory block not used to store data after performing the internal operation according to the second condition when the temperature is in the low temperature range, wherein the fake operation may comprise a program operation, an erase operation and a read operation. The performing of the internal operation may comprise: performing a first internal operation according to a first condition when the detected temperature is not in a low temperature range; or performing a second internal operation according to a second condition when the detected temperature is in the low temperature range. The second internal operation may comprise a fake operation performed on a set memory block not used to store data, the fake operation may comprise a program operation, a read operation or an erase operation, and the set memory block may comprise a bad block or a spare memory block.

In accordance with an embodiment of the present invention, a memory system may comprise: a memory device including a plurality of memory blocks; a temperature sensor suitable for detecting a temperature of the memory device; and a controller suitable for performing an internal operation on memory blocks of the plurality of memory blocks in accordance with the temperature and an execution condition, and changing the execution condition for the internal operation based on the detected temperature. The internal operation may include a background operation including at least one of a garbage collection, wear leveling and a read reclaim. The internal operation may comprise a background operation may comprise at least one of a garbage collection, wear leveling and a read reclaim. The execution condition for the internal operation may comprise at least one of an execution time, an amount of an execution target and an execution period. The controller is suitable for: performing a first internal operation according to a first condition when the temperature is in a normal temperature range, performing a second internal operation according to a second condition when the temperature is in a low temperature range, and performing a third internal operation according to a third condition when the temperature is in a high temperature range. The first internal operation is a garbage collection performed when the number of free memory blocks is N or less, the second internal operation is a garbage collection performed when the number of free memory blocks is K or less, where K is less than N, and the third internal operation is a garbage collection performed when the number of free memory blocks is B or less, where B is greater than N. The first internal operation is a wear leveling or a read reclaim performed on memory blocks having an erase count of N or more, the second internal operation is a wear leveling or a read reclaim performed on memory blocks having an erase count of K or more, where K is less than N, and the third internal operation is a wear leveling or a read reclaim performed on memory blocks having an erase count of B or more, where B is greater than N. The controller is suitable for further performing a fake operation performed on a set memory block not used to store data after performing the second internal operation according to the second condition when the temperature is in the low temperature range, and the set memory block may comprise a bad block or a spare memory block.

In accordance with an embodiment of the present invention, a memory system may comprise: a method of controlling temperature in a memory system including a memory device, the method may comprise: detecting temperature in the memory device; performing, on the memory device, a low temperature condition background operation or a fake operation when the detected temperature is less than a first reference temperature; comparing the detected temperature to a second reference temperature when the detected temperature is greater than or equal to the first reference temperature; performing a high temperature condition background operation on the memory device when the detected temperature is greater than or equal to a second reference temperature, which is higher than the first reference temperature; and performing a normal temperature condition background operation on the memory device when the detected temperature is between the first and second reference temperatures. The method may further comprise: detecting temperature in the memory device again, after performing the low temperature condition background operation or the fake operation; and performing on the memory device the low temperature condition background operation or the fake operation that was not previously performed when the detected temperature is less than a first reference temperature.

BRIEF DESCRIPTION OF THE DRAWINGS

FIG. 9 is a diagram illustrating a method of performing an internal operation by a memory system according to another embodiment of this disclosure.

DETAILED DESCRIPTION

Figure 1:
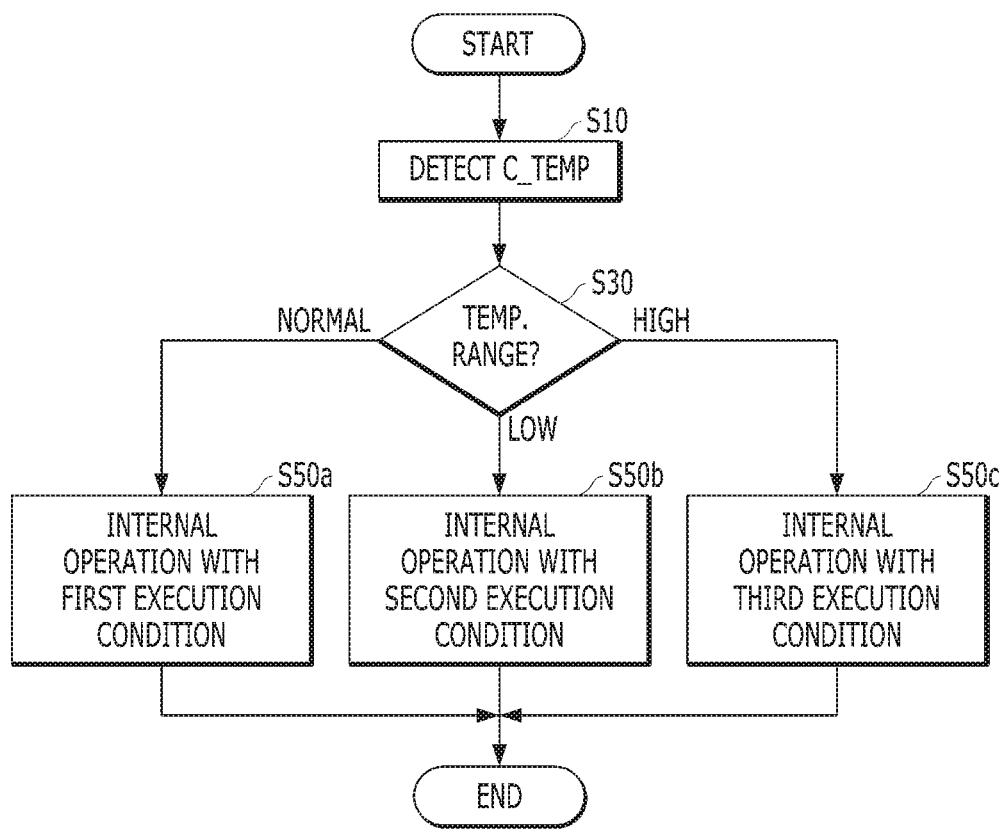
FIG. 1 illustrates a method of performing an internal operation by a memory system according to an embodiment of this disclosure.

Various embodiments of this disclosure are described below in more detail with reference to the accompanying drawings. Elements and features of this disclosure, however, may be configured or arranged differently to form other embodiments, which may be variations of any of the disclosed embodiments. Thus, the invention is not limited to the embodiments set forth herein. Rather, the described embodiments are provided so that this disclosure is thorough and complete and fully conveys the scope of this disclosure to those skilled in the art to which this invention pertains. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without implying any change to the form or function of the underlying element.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms, unless the context clearly indicates otherwise. The articles 'a' and 'an' as used in this application and the appended claims should generally be construed to mean 'one or more' unless specified otherwise or it is clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of this disclosure and the relevant art, and are not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, various embodiments are described in more detail below with reference to the accompanying drawings.

FIG. 1 is a diagram illustrating a method of performing, by a memory system according to an embodiment of this disclosure, an internal operation.

A memory system according to an embodiment of this disclosure includes a memory device including a plurality of memory blocks and a controller controlling the memory device. Each of the plurality of memory blocks includes a plurality of memory cells. If memory cells have a too low or high temperature, the probability that data corruption may occur may rise. Accordingly, when the temperature of the memory device becomes low or high, an error may occur in an operation of the memory device.

In order to prevent such a problem, the memory device according to an embodiment of this disclosure may include a temperature sensor for detecting a current temperature of the memory device. The temperature sensor may be positioned within the memory device in order to detect an accurate temperature of the memory device. However, this invention is not limited any specific positioning of the temperature sensor, as long as it is able to accurately detect the temperature of the memory device. In one embodiment, the memory device may receive temperature information from an external circuit operating in conjunction with the memory device.

Furthermore, a controller according to an embodiment of this disclosure may differently set the condition, in which an internal operation performed in the memory device is performed, based on a current temperature of the memory device. The condition in which an internal operation is performed may include execution time, an amount of an execution target which may include the number of target memory block, and an execution period. In this case, the internal operation may include a background (BG) operation which may be autonomously performed by the memory system or a fake operation having less influence on data safety and using a bad block or spare memory block not used to store data in the memory device. For example, the BG operation may include a garbage collection and wear leveling. The fake operation may include programming dummy data in a bad block or spare memory block, reading data stored in a bad block or spare memory block, or erasing data stored in a bad block or spare memory block. The bad block or spare memory block may have less influence on the safety of valid data stored in the memory device even when an operation, such as program, read or erase, is performed on the bad block or spare memory block because it does not include valid data.

Hereinafter, a method of controlling, by a memory system according to an embodiment of this disclosure, a temperature of a memory device is described with reference to FIG. 1.

A temperature sensor detects a current temperature C_TEMP of the memory device (S10). A controller determines a temperature range to which the detected current temperature belongs (S30). If the current temperature is in a normal temperature range, the controller performs an internal operation according to a first execution condition (S50a). If the current temperature is in a low temperature range, the controller performs an internal operation according to a second execution condition (S50b). If the current temperature is in a high temperature range, the controller performs an internal operation according to a third execution condition (S50c).

The execution time of the internal operation according to the second execution condition may be set so that the internal operation is performed more frequently compared to an execution time of the internal operation according to the first execution condition. Accordingly, frequency of the internal operation performed in the low temperature range may be higher than that in the normal temperature range. Furthermore, the number of execution targets of the internal operation according to the second execution condition may be set to be greater than that according to the first execution condition. Accordingly, the execution time of the internal operation in the low temperature range may be longer than that in the normal temperature range. Furthermore, an execution period of the internal operation according to the second execution condition may be set to be shorter than that according to the first execution condition. Accordingly, frequency of the internal operation performed in the high temperature range may be higher than that in the normal temperature range. In conclusion, the amount of heat generated from the memory device in the low temperature range may be greater than that in the normal temperature range due to the execution time of the internal operation and the frequency of the internal operation performed in the low temperature range. Accordingly, the temperature of the memory device in the low temperature range may gradually rise.

The execution time of the internal operation according to the third execution condition may be set so that the internal operation is performed less frequently compared to an execution time of the internal operation according to the first execution condition. Accordingly, frequency that the internal operation is performed in the high temperature range may be lower than that in the normal temperature range. Furthermore, the number of execution targets of the internal operation according to the third execution condition may be set to be less than that according to the first execution condition. Accordingly, the execution time of the internal operation in the low temperature range may be shorter than that in the normal temperature range. Furthermore, an execution period of the internal operation according to the third execution condition may be set to be longer than that according to the first execution condition. Accordingly, frequency that the internal operation is performed in the high temperature range may be lower than that in the normal temperature range. In conclusion, the amount of heat generated from the memory device in the high temperature range may be less than that in the normal temperature range due to the execution time of the internal operation and frequency that the internal operation is performed in the high temperature range. Accordingly, the temperature of the memory device in the high temperature range may gradually fall.

The internal operations performed according to the first to third execution conditions at steps S50a, S50b and S50c of FIG. 1 may include a BG operation performed on a memory block under the control of the controller without a request from a host.

A BG operation according to an embodiment of this disclosure may include wear leveling, read reclaim, garbage collection and/or resultant map data management. For example, when a garbage collection is needed or desired in a memory system or a set time elapses from the last time at which a garbage collection was performed, the memory system may induce a rise in temperature of a memory device by performing a garbage collection. In contrast, the memory system may delay execution of a garbage collection in order to avoid a rise in temperature within the range in which input and output performance are not degraded.

The wear leveling includes an operation of changing a storage location by copying data, stored in a memory block having a relatively high erase count, to a memory block having a relatively low erase count. The read reclaim includes an operation of changing a storage location by copying data, stored in a memory block having a relatively high read count, to a memory block having a relatively low read count. The garbage collection includes an operation of moving data, stored in a memory block in which valid data are scattered, to a free memory block and erasing the corresponding memory block. The map data management includes an operation of maintaining a mapping table in the latest state by modifying the mapping table so that a changed physical address not an invalidated physical address is mapped to a logical address.

A memory system according to an embodiment of this disclosure can improve the reliability of a memory device by performing wear leveling and a read reclaim on the memory device so that data is not stored in a bad block but is stored in a normal memory block. A memory system according to an embodiment of this disclosure can improve efficiency of data storage in the memory device by performing a garbage collection on the memory device to increase the number of free blocks. A memory system according to an embodiment of this disclosure can increase the memory operation speed by performing a memory operation on the memory device using a mapping table having the latest state through map data management. A BG operation is described in detail with reference to FIGS. 7A to 7D.

Furthermore, a memory system according to an embodiment of this disclosure induces a rise or fall in temperature of a memory device when a current temperature of the memory device is in a set low temperature range or high temperature range, respectively, by differently setting an execution condition for a BG operation based on the current temperature of the memory device. Accordingly, the memory system according to an embodiment of this disclosure can effectively reduce the occurrence of a malfunction and/or data error in the memory device, and can improve the reliability of storage data in the memory device.

Furthermore, when the current temperature detected at step S10 is in the low temperature range, after performing the internal operation (e.g., BG operation) according to the second execution condition (S50b), the controller may further perform a fake operation on a select memory block that is not used to store data, which may be predetermined. The select memory block not used to store data according to an embodiment of this disclosure may include a spare memory block or a bad block. The memory block not used to store data according to an embodiment of this disclosure may include a bad block BB. The bad block BB may occur in a process of fabricating a semiconductor apparatus or may be discovered or designated during an operation of a semiconductor apparatus.

If the number of error bits included in read-out data is a set number of error bits or more, a memory block in which the read-out data is stored may be designated as a bad block BB. Furthermore, a memory block whose program and erase counts of data are at or above a set level (e.g., wear-out level WOL) may be designated as a bad block BB. Furthermore, a memory block having a retention time of programmed data shorter than a set time may be designated as a bad block BB. Furthermore, a memory block whose read count of data is at or above a set level (e.g., WOL) may be designated as a bad block BB. This is described in detail with reference to FIGS. 6A and 6B.

A fake operation according to an embodiment of this disclosure includes a memory operation performed on a bad block BB or spare memory block included in a memory device. The fake operation may include an erase operation, a read operation and/or a program operation. A fake operation according to an embodiment of this disclosure is performed to raise the temperature of the memory device above the low temperature range. The controller does not need to consider the results of the execution of the fake operation and the possibility that a bad block BB or spare memory block may be degraded because such block is no longer used to store data.

If bad blocks BB or spare memory blocks are not sequentially present, but are uniformly scattered in a memory die, a fake operation may be performed using a memory interleaving method. Furthermore, the fake operation may be performed in an idle state in which there is a good possibility that the memory system may be in a low temperature state. Furthermore, the fake operation may be performed when the state of the memory system is in a low temperature state even when the memory system is not idle, i.e., is in a normal state in which the memory system performs a normal operation. In this case, the block operation may be performed within a range that does not hinder the normal operation of the memory system.

The operation of the memory system described with reference to FIG. 1 according to an embodiment of this disclosure may be performed by a memory system illustrated in FIGS. 2 to 5. The method of performing an internal operation is described in more detail with reference to FIGS. 6A to 11.

Figure 2:
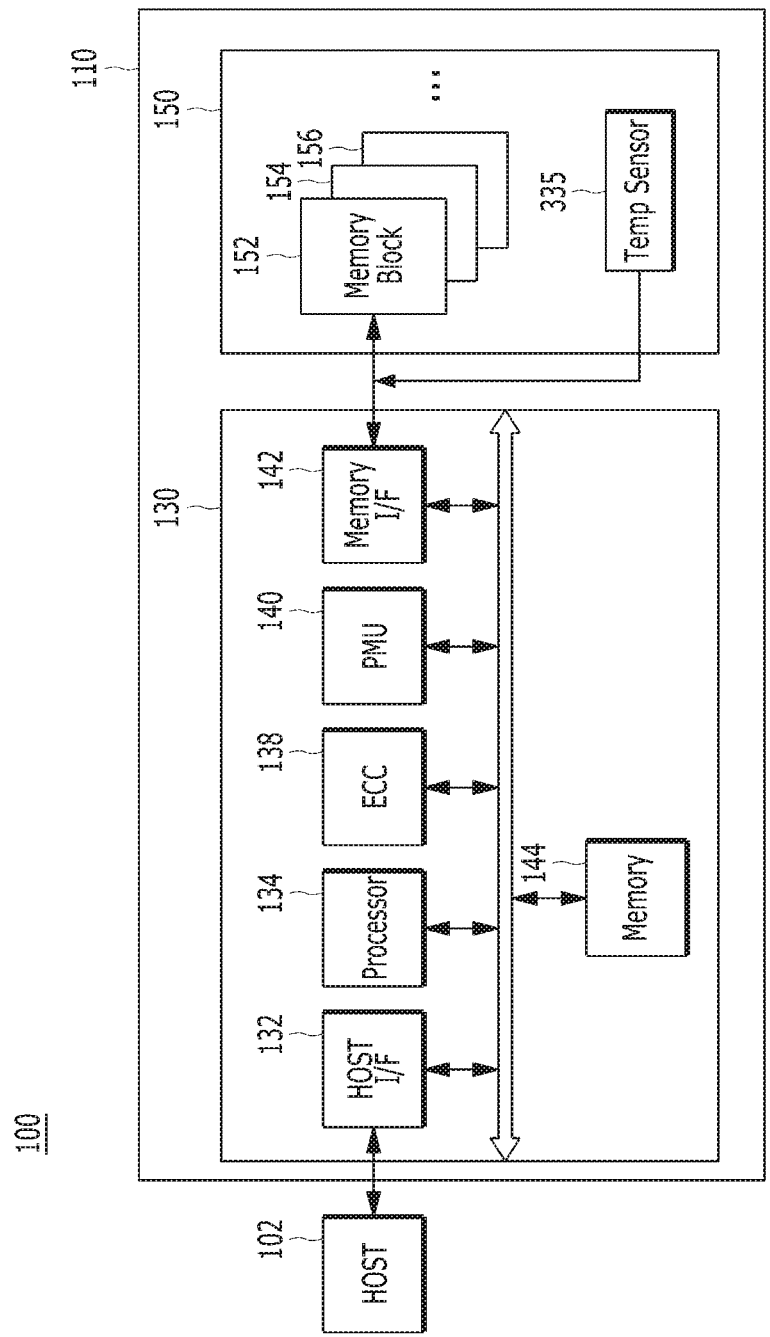
FIG. 2 illustrates a configuration of a data processing system including a memory system according to an embodiment of this disclosure.

FIG. 2 is a block diagram illustrating a data processing system 100 according to an embodiment of the present invention.

Referring to FIG. 2, a data processing system 100 may include a host 102 engaged or operably coupled to a memory system 110.

The host 102 may include, for example, a portable electronic device such as a mobile phone, an MP3 player and a laptop computer, or an electronic device such as a desktop computer, a game player, a television (TV), a projector and the like.

The host 102 also includes at least one operating system (OS), which can generally manage, and control functions and operations performed in the host 102. The OS can provide interoperability between the host 102 engaged with the memory system 110 and the user needing and using the memory system 110. The OS may support functions and operations corresponding to user's requests. By way of example but not limitation, the OS can be a general operating system or a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix and the like. Further, the mobile operating system may include an Android, an iOS, a Windows mobile and the like. The mobile operating system may be subject to support services or functions for mobility (e.g., a power saving function). The host 102 may include a plurality of operating systems. The host 102 may execute multiple operating systems, corresponding to a user's request. The host 102 may transmit a plurality of commands corresponding to the user's requests to the memory system 110, thereby performing operations corresponding to commands within the memory system 110. Handling plural commands in the memory system 110 is described below with reference to FIGS. 4 and 5.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be so integrated into an SSD to improve an operation speed. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMC-micro), a SD card (SD, miniSD, microSD, SDHC), a universal flash memory or the like.

The memory device 150 may include a temperature sensor 335 that detects a current temperature of the memory device 150. The temperature sensor 335 may be disposed within the memory device 150 to accurately measure the temperature of the memory device, but the present invention is not limited to any specific placement of the temperature sensor 335 so long as it accurately measures the temperature of the memory device 150. In one embodiment of the invention, the temperature sensor 335 may measure the current temperature under the control of the controller 130. The temperature sensor 335 may also provide the measured current temperature to the controller 130. Thus, the controller 130 compares the current temperature with a reference temperature, and determines the temperature range to which the current temperature belongs. The reference temperature may be preset and stored in the controller 130.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device that retains stored data even when electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes a plurality of memory blocks. In addition, the memory device 150 may be a non-volatile memory device, for example a flash memory, wherein the flash memory may be a three-dimensional stack structure.

The controller 130 may control overall operations of the memory device 150, such as read, write, program, and erase operations. For example, the controller 130 may control the memory device 150 in response to a request from the host 102. The controller 130 may provide the data, read from the memory device 150, to the host 102. The controller 130 may store the data, provided by the host 102, into the memory device 150.

The controller 130 may include a host interface (I/F) 132, a processor 134, an error correction code (ECC) component 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and/or integrated drive electronics (IDE). According to an embodiment, the host interface 132 exchanges data with the host 102, which may be implemented through firmware called a host interface layer (HIL).

The ECC component 138 can correct error bits of the data to be processed in (e.g., outputted from) the memory device 150, which may include an ECC encoder and an ECC decoder. Here, the ECC encoder can perform error correction encoding of data to be programmed in the memory device 150 to generate encoded data to which a parity bit is added and store the encoded data in memory device 150. The ECC decoder can detect and correct errors contained in a data read from the memory device 150 when the controller 130 reads the data stored in the memory device 150. In other words, after performing error correction decoding on the data read from the memory device 150, the ECC component 138 can determine whether the error correction decoding has succeeded and output an instruction signal (e.g., a correction success signal or a correction fail signal). The ECC component 138 can use the parity bit which is generated during the ECC encoding process, for correcting the error bit of the read data. When the number of error bits is greater than or equal to a threshold number of correctable error bits, the ECC component 138 may not correct error bits but instead may output an error correction fail signal indicating failure in correcting the error bits.

The ECC component 138 may perform an error correction operation based on a coded modulation, such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), and/or a Block coded modulation (BCM). The ECC component 138 may include any and all circuits, modules, systems or devices for performing the error correction operation based on at least one of the above described codes.

The PMU 140 may manage, control or provide an electrical power provided in the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 can provide an interface for handling commands and data between the controller 130 and the memory device 150, for example, operations of a NAND flash interface, in particular, operations between the controller 130 and the memory device 150. According to an embodiment, the memory interface 142 can be implemented through firmware called a Flash Interface Layer (FIL) as a component for exchanging data with the memory device 150.

The memory 144 may support operations performed by the memory system 110 and the controller 130. The memory 144 may store temporary or transactional data for operations in the memory system 110 and the controller 130. The controller 130 may control the memory device 150 in response to a request from the host 102. The controller 130 may deliver data read from the memory device 150 to the host 102. The controller 130 may store data entered through the host 102 within the memory device 150. The memory 144 may be used to store data for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 2 exemplifies the second memory 144 disposed within the controller 130, the present invention is not limited thereto. That is, the memory 144 may be located within or external to the controller 130. For instance, the memory 144 may be embodied by an external volatile memory having a memory interface transferring data and/or signals between the memory 144 and the controller 130.

The memory 144 can store data for performing operations such as data writing and data reading requested by the host 102 and/or data transfer between the memory device 150 and the controller 130 for background operations such as garbage collection and wear levelling as described above. According to an embodiment, for supporting operations in the memory system 110, the memory 144 may include a program memory, a data memory, a write buffer/cache, a read buffer/cache, a data buffer/cache, a map buffer/cache, and the like.

The memory 144 may store map data and state information. The controller map data includes L2P map data comprising L2P segments including a logical address used in the host 102 and a physical address of the memory device 150 corresponding to the logical address. The controller map data may further include P2L map data comprising P2L segments including the physical address used and the logical address corresponding to the physical address.

According to an embodiment, when an erase request E_REQ with the first logical address from the host 102 is received, the controller 130 correlates the first logical address from the host 102 to erase information E_INF including an erased physical address EPA or an erased state value EV. At this time, the controller 130 may perform an unmap operation to the first logical address by invalidating a physical address mapped to the first logical address in the map data. Then the controller 130 corresponds the first logical address into an erased physical address EPA or an erased state value EV in the map data.

In addition, the memory 144 may store state information as well as controller map data. The state information may include dirty information, invalid address information, valid storage element information, free block number information, and erased state information. The memory system 110 may determine validity of a physical address and a logical address received with an erase request E_REQ from a host 102 using dirty information or invalid address information.

In an embodiment of the present disclosure, when the erase request E_REQ is received with the logical address, the controller 130 updates an erase state information of the logical address to have an erase state value EV. In addition, the memory system 110 may invalidate a physical address corresponding to a logical address of the erase request E_REQ, and then change the valid page count VPC of the memory block corresponding to the invalidated physical address. In addition, the memory system may perform garbage collection on a memory block having a number of valid pages less than a set number. When the free block number information is less than or equal to a set number, the memory system 110 may perform garbage collection.

The processor 134 may be implemented with a microprocessor and/or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. According to an embodiment, the processor 134 may use or execute firmware to control the overall operations of the memory system 110. Herein, the firmware may be referred to as a flash translation layer (FTL). The FTL may perform an operation such as, an interface between the host 102 and the memory device 150. The host 102 may transmit requests for write and read operations to the memory device 150 through the FTL.

The FTL may manage operations of address mapping, garbage collection, wear-leveling and the like. Particularly, the FTL may load, generate, update, or store map data. Therefore, the controller 130 may map a logical address, which is entered from the host 102, with a physical address of the memory device 150 through the map data. The memory device 150 may act like a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the previous particular page to the another newly programed page) due to a characteristic of a flash memory device. Further, the controller 130 may store map data of the new data into the FTL.

For example, when performing an operation requested from the host 102 in the memory device 150, the controller 130 uses the processor 134 implemented in a microprocessor or central processing unit (CPU) or the like. The processor 134 engaged with the memory device 150 can handle instructions or commands corresponding to an inputted command from the host 102. The controller 130 can perform a foreground operation as a command operation, corresponding to a command inputted from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes copying data stored in a memory block among the memory blocks 152, 154, 156 in the memory device 150 to another memory block, e.g., a garbage collection (GC) operation. The background operation can include moving or swapping data stored in at least one of the memory blocks 152, 154, 156 into at least another of the memory blocks 152, 154, 156, e.g., a wear leveling (WL) operation. During a background operation, the controller 130 may use the processor 134 for storing the map data stored in the controller 130 to at least one of the memory blocks 152, 154, 156 in the memory device 150, e.g., a map flush operation. A bad block management operation of checking or searching for bad blocks among the memory blocks 152, 154, 156 is another example of a background operation performed by the processor 134.

In the memory system 110, the controller 130 performs a plurality of command operations corresponding to a plurality of commands entered from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 can determine which channel(s) or way(s) among a plurality of channels (or ways) for connecting the controller 130 to a plurality of memory dies included in the memory 150 is/are proper or appropriate for performing each operation. The controller 130 can send or transmit data or instructions via determined channels or ways for performing each operation. The plurality of memory dies included in the memory 150 can transmit an operation result via the same channels or ways, respectively, after each operation is complete. Then, the controller 130 may transmit a response or an acknowledge signal to the host 102. In an embodiment, the controller 130 can check a status of each channel or each way. In response to a command entered from the host 102, the controller 130 may select at least one channel or way based on the status of each channel or each way so that instructions and/or operation results with data may be delivered via selected channel(s) or way(s).

By way of example but not limitation, the controller 130 can recognize statuses regarding a plurality of channels (or ways) associated with a plurality of memory dies included in the memory device 150. The controller 130 may determine the state of each channel or each way as a busy state, a ready state, an active state, an idle state, a normal state and/or an abnormal state. The controller's determination of which channel or way an instruction (and/or a data) is delivered through can be associated with a physical block address, e.g., which die(s) the instruction (and/or the data) is delivered to. The controller 130 can refer to descriptors delivered from the memory device 150. The descriptors can include a block or page of parameters that describe something about the memory device 150, which is data with a specific format or structure. For instance, the descriptors may include device descriptors, configuration descriptors, unit descriptors, and the like. The controller 130 can refer to, or use, the descriptors to determine with which channel(s) or way(s) an instruction or a data is exchanged.

A management unit (not shown) may be included in the processor 134. The management unit may perform bad block management of the memory device 150. The management unit may find bad memory blocks in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Figure 3:
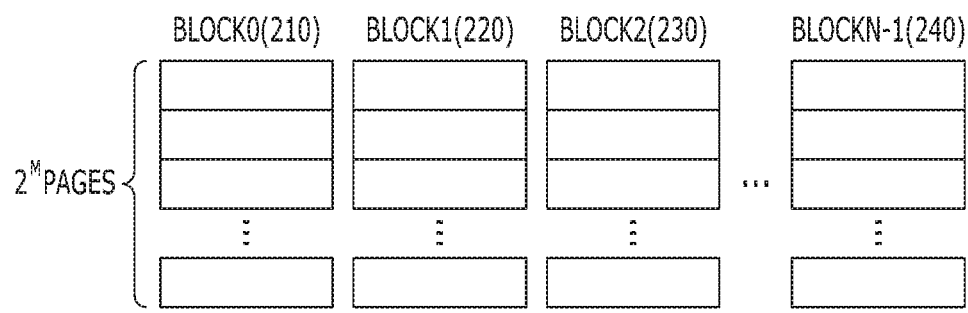
FIG. 3 illustrates a configuration of a memory device shown in FIG. 2.

FIG. 3 is a schematic diagram illustrating a configuration of a memory device employed in the memory system of FIG. 2.

Figure 4:
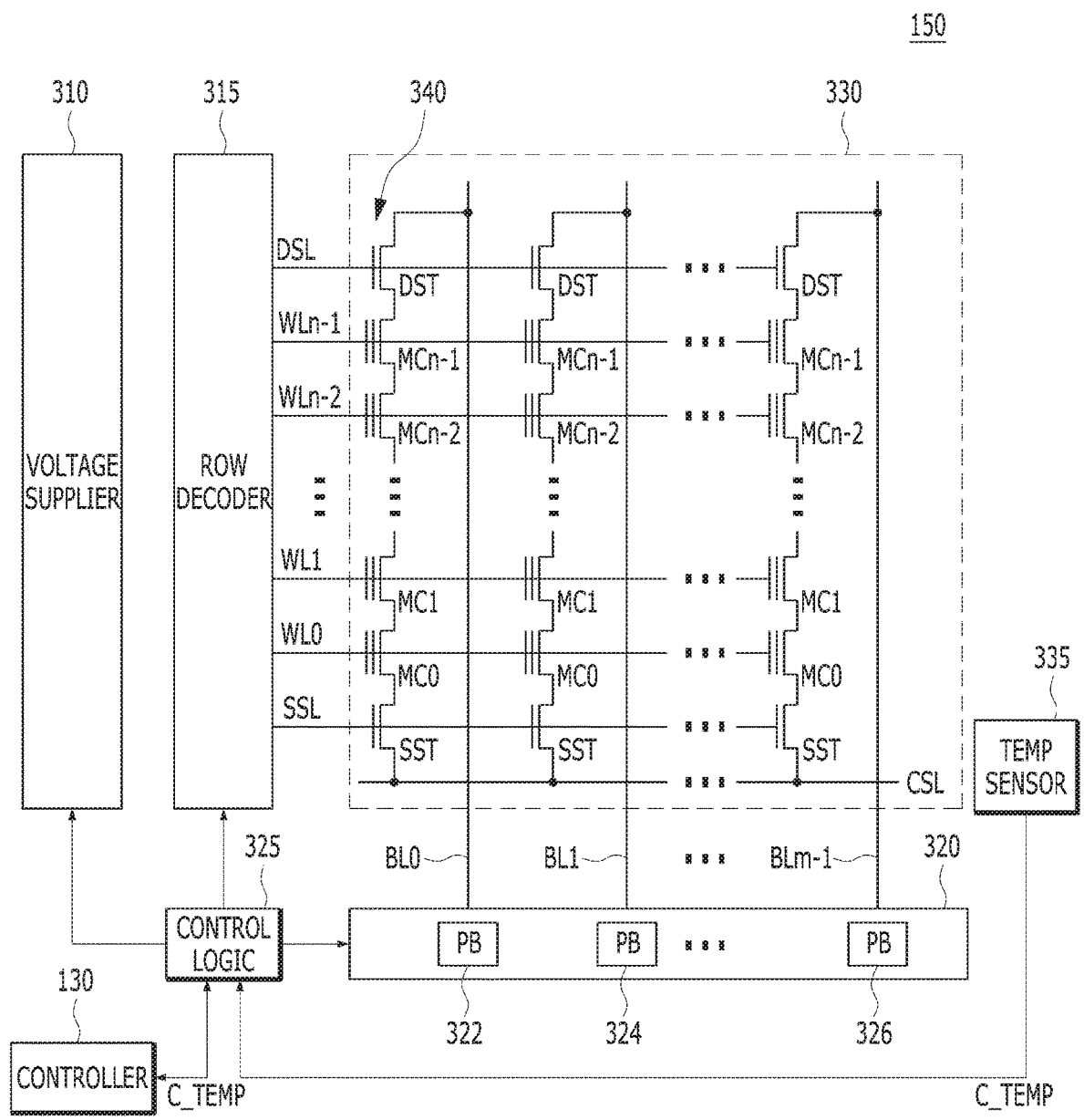
FIG. 4 illustrates a configuration of a memory cell array of a memory block in the memory device shown in FIG. 2.

FIG. 4 is a circuit diagram illustrating a configuration of a memory cell array 330 of a memory block in the memory device 150.

Referring to FIG. 3, the memory device 150 may include a plurality of memory blocks BLOCK0 to BLOCKN-1, e.g., BLOCK0 (210), BLOCK1 (220), BLOCK2 (230), and to BLOCKN-1 (240). Each of the memory blocks 210, 220, 230 and 240 may include a plurality of pages, for example 2M pages, the number of which may vary according to circuit design. For example, in some applications, each of the memory blocks may include M pages. Each of the pages may include a plurality of memory cells that are coupled to a word line WL.

Furthermore, each of the plurality of memory blocks in the memory device 150 may be implemented with a single level cell (SLC) memory block with memory cells each capable of storing one bit of data, or a multi-level cell (MLC) memory block with memory cells each capable of storing two or more bits of data. Some examples of MLC memory blocks are a double level cell memory block (also called an MLC memory block), a triple level cell (TLC) memory block, and a quadruple level cell (QLC) memory block.

According to an embodiment of the present invention, the memory device 150 may be a non-volatile memory, such as a flash memory, e.g., a NAND flash memory. However, the memory device 150 may be realized as any one of a Phase Change Random-access Memory (PCRAM), a Resistive Random-access Memory (RRAM or ReRAM), a Ferroelectric Random-access Memory (FRAM), a Spin Transfer Torque Magnetic Random-access Memory (STT-RAM or STT-MRAM) and the like.

The memory blocks 210, 220, 230, . . . 240 may store the data transferred from a host through a program operation, and transfer data stored therein to the host through a read operation.

FIG. 4 is a circuit diagram illustrating a memory block 330 in the memory device 150.

Referring to FIG. 4, the memory device 150 may include a memory block 330 comprising a plurality of memory cell arrays, a row decoder 315, a read/write circuit 320, a voltage supplier 310, and a control logic 325. The memory device 150 may include a temperature sensor 335 that detects a current temperature of the memory device 150. The temperature sensor 335 may be located inside the memory device 150 to accurately measure the temperature of the memory device, but as previously noted the present invention is not limited thereto. In one embodiment of the invention, the temperature sensor 335 may measure the current temperature under the control of control logic 325. The temperature sensor 335 may also provide the measured current temperature to the control logic 325. The control logic 325 may also provide the measured current temperature to a controller 130 (shown in FIG. 2). Thus, the controller 130 compares the current temperature with a reference temperature, and determines the temperature range to which the current temperature belongs. The reference temperature may be preset and stored in the controller 130.

Referring to FIG. 4, the memory block 330 may correspond to any of the plurality of memory blocks 152 to 156.

The memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured as single level cells (SLC) each of which may store 1 bit of information, or by multi-level cells (MLC) each of which may store data information of a plurality of bits. The strings 340 may be electrically coupled to the corresponding bit lines BL0 to BLm−1, respectively. For reference, in FIG. 4, 'DSL' denotes a drain select line, 'SSL' denotes a source select line, and 'CSL' denotes a common source line.

While FIG. 4 only shows, as an example, that the memory block 330 is constituted with NAND flash memory cells, it is to be noted that the memory block 330 of the memory device 150 is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supplier 310 of the memory device 150 may provide word line voltages, for example, a program voltage, a pass voltage, a selection read voltage and non-selection read voltage, among other possible voltages to be supplied to respective word lines according to an operation mode and voltages to be supplied to bulks, for example, well regions in which the memory cells are formed. The voltage supplier 310 may perform a voltage generating operation under the control of control logic 325. The voltage supplier 310 may generate a plurality of variable read voltages to generate a plurality of read data, select one of the memory blocks or sectors of a memory cell array under the control of the control logic 325, select one of the word lines of the selected memory block, and provide the word line voltages to the selected word line and unselected word lines.

The row decoder 315 of the memory device 150 may select one of a plurality of the memory blocks 330 in response to an address ADDR. The row decoder 315 may select one of word lines of the selected memory block. The row decoder 315 may transfer a word line voltage, from the voltage supplier 310 to the selected word line. During a program operation, the row decoder 315 may transfer a program/verification voltage to the selected word line and a pass voltage Vpass to each of unselected word lines.

The read/write circuit 320 of the memory device 150 may be controlled by the control logic 325, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The control logic 325 may control the row decoder 315, the read/write circuit 320, and the voltage supplier 310 in response to a command from a controller 130 (see FIG. 2). The control logic 325 may control the voltage supplier 310 and the read/write circuit 320 in response to a write command such that data (DATA) from the outside are programmed in selected memory cells. For example, the selected memory cells may be programmed in an incremental step pulse programming (ISPP) scheme under control of the control logic 325.

In the ISPP scheme, a program cycle for programming the selected memory cells (e.g., memory cells connected to one word line) is performed. One program cycle (or program operation) is composed of a plurality of program loops. In each program loop, at least one program pulse and at least one verification pulse are used. The program pulse has a level of the program voltage Vpgm, and the verification pulse has a level of the verification voltage. In the ISPP scheme, a level of the program voltage Vpgm may increase as a loop count increases.

Figure 5:
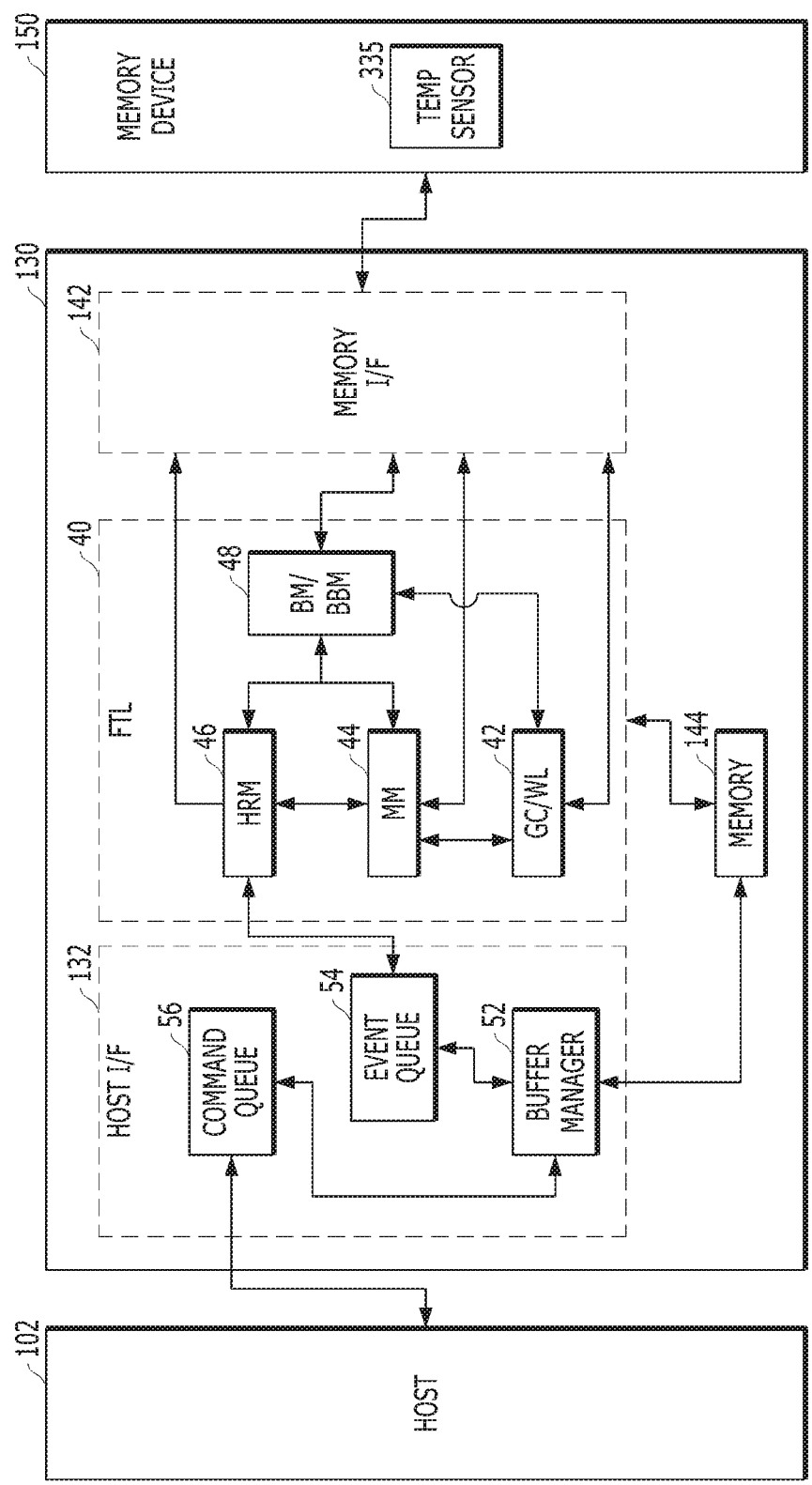
FIG. 5 illustrates a configuration of a memory system according to an embodiment of this disclosure.

Referring to FIG. 5, a controller in a memory system according to another embodiment of this disclosure is described in detail. The memory system shown in FIG. 5 may correspond to at least one of the plurality of memory systems 110 shown in FIG. 2. The controller 130 cooperates with the host 102 and the memory device 150. As illustrated, the controller 130 includes a host interface 132, a flash translation layer (FTL) 40, as well as the host interface 132, the memory interface 142 and the memory 144 previously identified in connection with FIG. 2.

Although not shown in FIG. 5, according to an embodiment, the ECC component 138 described in FIG. 2 may be included in the flash translation layer (FTL) 40. In another embodiment, the ECC component 138 may be implemented as a separate module, a circuit, firmware or the like, which is included in, or associated with, the controller 130.

The host interface 132 is for handling commands, data, and the like transmitted from the host 102. By way of example but not limitation, the host interface 132 may include a command queue 56, a buffer manager 52 and an event queue 54. The command queue 56 may sequentially store commands, data, and the like received from the host 102 and output them to the buffer manager 52 in an order in which they are stored. The buffer manager 52 may classify, manage or adjust the commands, the data, and the like, which are received from the command queue 56. The event queue 54 may sequentially transmit events for processing the commands, the data, and the like received from the buffer manager 52.

A plurality of commands or data of the same characteristic, e.g., read or write commands, may be transmitted from the host 102, or commands and data of different characteristics may be transmitted to the memory system 110 after being mixed or jumbled by the host 102. For example, a plurality of commands for reading data (read commands) may be delivered, or read commands and commands for programming/writing data (write commands) may be alternately transmitted to the memory system 110. The host interface 132 may store commands, data, and the like, which are transmitted from the host 102, to the command queue 56 sequentially. Thereafter, the host interface 132 may estimate or predict what kind of internal operation the controller 130 will perform according to the characteristics of commands, data, and the like, which have been received from the host 102. The host interface 132 can determine a processing order and a priority of commands, data and the like, based at least on their characteristics. According to characteristics of commands, data, and the like transmitted from the host 102, the buffer manager 52 in the host interface 132 is configured to determine whether the buffer manager should store commands, data, and the like in the memory 144, or whether the buffer manager should deliver the commands, the data, and the like into the flash translation layer (FTL) 40. The event queue 54 receives events, entered from the buffer manager 52, which are to be internally executed and processed by the memory system 110 or the controller 130 in response to the commands, the data, and the like transmitted from the host 102, to deliver the events into the flash translation layer (FTL) 40 in the order received.

According to an embodiment, the host interface 132 described in FIG. 5 may perform some functions of the controller 130 described in FIG. 2. The host interface 132 may set the first memory 104 in the host 102 as a slave and add the first memory 104 as an additional storage space which is controllable or usable by the controller 130.

According to an embodiment, the flash translation layer (FTL) 40 can include a host request manager (HRM) 46, a map manager (MM) 44, a state manager (GC/WL) 42 and a block manager (BM/BBM) 48. The host request manager (HRM) 46 can manage the events entered from the event queue 54. The map manager (MM) 44 can handle or control map data. The state manager (GC/WL) 42 can perform garbage collection (GC) or wear leveling (WL). The block manager 48 can execute commands or instructions on a block in the memory device 150.

By way of example but not limitation, the host request manager (HRM) 46 can use the map manager (MM) 44 and the block manager 48 to handle or process requests according to the read and program commands, and events which are delivered from the host interface 132. The host request manager (HRM) 46 can send an inquiry request to the map data manager (MM) 44, to determine a physical address corresponding to the logical address which is entered with the events. The host request manager (HRM) 46 can send a read request with the physical address to the memory interface 142, to process the read request (handle the events). On the other hand, the host request manager (HRM) 46 can send a program request (write request) to the block manager 48, to program data to a specific empty page (currently having no data) in the memory device 150, and then, can transmit a map update request corresponding to the program request to the map manager (MM) 44, to update an item relevant to the programmed data in information of mapping the logical-physical addresses to each other.

Here, the block manager 48 can convert a program request delivered from the host request manager (HRM) 46, the map data manager (MM) 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. In an embodiment, the block manager 48 sends several flash program requests to the memory interface 142 to enhance or maximize parallel processing of the multi-channel and multi-directional flash controller.

On the other hand, the block manager 48 can be configured to manage blocks in the memory device 150 according to the number of valid pages, select and erase blocks having no valid pages when a free block is needed, and select a block including the least number of valid pages when it is determined that garbage collection is necessary. The state manager 42 can perform garbage collection to move the valid data to an empty block and erase the blocks containing the moved valid data so that the block manager 48 may have enough free blocks (empty blocks with no data). If the block manager 48 provides information regarding a block to be erased to the state manager 42, the state manager 42 may check all flash pages of the block to be erased to determine whether each page is valid. For example, to determine validity of each page, the state manager 42 can identify a logical address recorded in an out-of-band (OOB) area of each page. To determine whether each page is valid, the state manager 42 can compare the physical address of the page with the physical address mapped to the logical address obtained from the inquiry request. The state manager 42 sends a program request to the block manager 48 for each valid page. A mapping table can be updated through the update of the map manager 44 when the program operation is complete.

The map manager 44 can manage a logical-physical mapping table. The map manager 44 can process requests such as queries, updates, and the like, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request can be sent to the block manager 48 so that a clean cache block is made and the dirty map table may be stored in the memory device 150.

On the other hand, when garbage collection is performed, the state manager 42 copies valid page(s) into a free block, and the host request manager (HRM) 46 can program the latest version of the data for the same logical address of the page and currently issue an update request. When the state manager 42 requests the map update in a state in which copying of valid page(s) is not completed normally, the map manager 44 may not perform the mapping table update. It is because the map request is issued with old physical information when the state manger 42 requests a map update and a valid page copy is completed later. The map manager 44 may perform a map update operation to ensure accuracy only when the latest map table still points to the old physical address.

According to an embodiment, at least one of the state manager 42, the map manager 44 or the block manager 48 can include circuitry for performing its own operation. As used in this disclosure, the term 'circuitry' refers to any and all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even when the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and when applicable to a particular claim element, an integrated circuit for a storage device.

The memory device 150 can include a plurality of memory blocks. The plurality of memory blocks can be any of different types of memory blocks such as a single level cell (SLC) memory block, a multi level cell (MLC) memory block or the like, according to the number of bits that can be stored or represented in one memory cell. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have larger storage capacity for the same space compared to the SLC memory block. The MLC memory block can be highly integrated in a view of storage capacity. In an embodiment, the memory device 150 may be implemented with MLC memory blocks such as an MLC memory block, a triple level cell (TLC) memory block, a quadruple level cell (QLC) memory block and a combination thereof. The MLC memory block may include a plurality of pages implemented by memory cells, each capable of storing 2-bit data. The triple level cell (TLC) memory block can include a plurality of pages implemented by memory cells, each capable of storing 3-bit data. The quadruple level cell (QLC) memory block can include a plurality of pages implemented by memory cells, each capable of storing 4-bit data. In another embodiment, the memory device 150 can be implemented with a block including a plurality of pages implemented by memory cells, each capable of storing 5-bit or more bit data.

Hereinafter, a method of improving, by the memory system 110 according to an embodiment of this disclosure, data reliability is described with reference to FIGS. 2 to 5, 6A and 6B. In particular, FIGS. 6A and 6B illustrate methods of designating, by the memory system 110 according to an embodiment of this disclosure, a bad block (bad block BB).

A bad block BB according to an embodiment of this disclosure means a memory block that is not used to store data. The bad block BB may occur in a process of fabricating a semiconductor apparatus or may be discovered or designated during an operation of a semiconductor apparatus.

Referring to FIGS. 2 to 5 and 6A, the memory system 110 according to an embodiment of this disclosure may perform a bad block BB designation operation using a data retention time tR of a memory block.

Figure 6A:
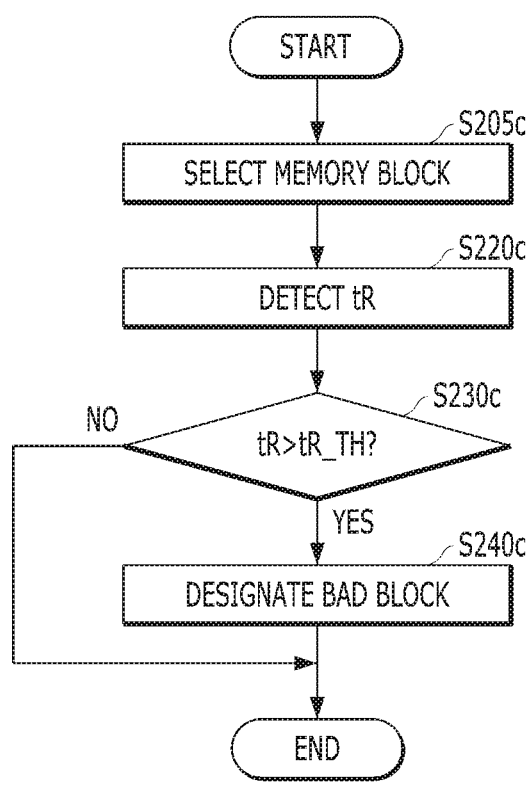
FIGS. 6A and 6B illustrate methods of designating a bad block, by a memory system according to an embodiment of this disclosure.
Figure 6B:
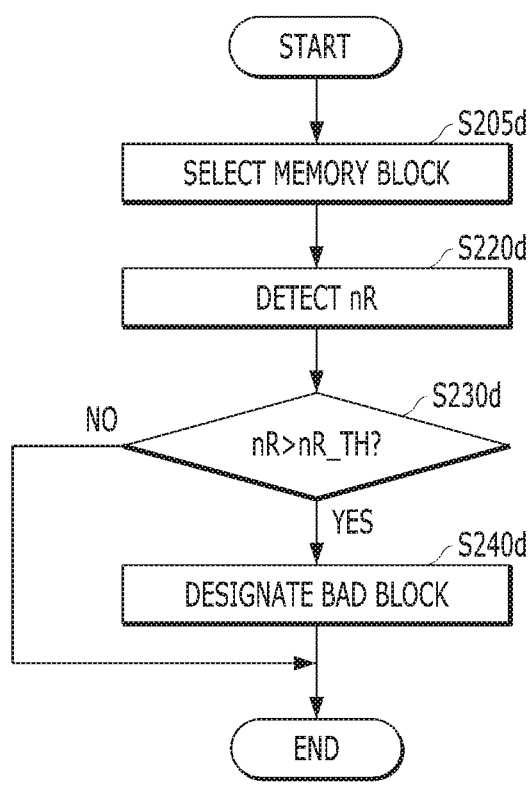

Referring to FIG. 6A, the controller 130 selects a memory block included in the memory device 150 (S205c). Furthermore, the controller 130 detects a data retention time tR in the selected memory block (S220c).

The selection of the memory block and the detection of the data retention time tR may be performed based on a read request received from the host 102 and an address (e.g., logical address or physical address) received along with the read request. Furthermore, the selection of the memory block and the detection of the data retention time tR may be one of periodic and aperiodic memory management operations performed under the control of the controller 130.

Furthermore, the data retention time tR of each of memory blocks in the memory device 150 may be included in state information STATE_INF stored in the memory 144 which is used as the buffer/cache memory of the controller 130, and may be configured, managed and updated in the form of a table or list with respect to the memory block.

The controller 130 compares the detected data retention time tR with a set reference time tR_TH (S230c). That is, the controller 130 determines whether the detected data retention time tR is longer than the reference time tR_TH (S230c).

The controller 130 may set the reference time tR_TH identically with a data retention time set in fabricating the semiconductor apparatus. If the number of bad blocks BB is insufficient, the controller 130 may set the reference time tR_TH to be lower than a data retention time set in fabricating the semiconductor apparatus.

When, as a result of the determination at step S230c, the detected data retention time tR is longer than the reference time tR_TH ('YES' in S230c), the controller 130 designates the memory block, having the data retention time tR detected at step S220c, as a bad block BB (S240c). In contrast, when, as a result of the determination at step S230c, the detected data retention time tR is shorter than or equal to the reference time tR_TH ('NO' in S230c), the controller 130 does not designate the memory block, having the data retention time tR detected at step S220c, as a bad block BB.

The memory block designated as the bad block BB at step S240c is no longer used to store data. Accordingly, data reliability of the memory device 150 according to an embodiment of this disclosure can be improved.

Referring to FIGS. 2 to 5 and 6B, the memory system 110 according to an embodiment of this disclosure may perform a bad block BB designation operation using the data read count nR of a memory block.

As shown in FIG. 6B, the controller 130 selects a memory block included in the memory device 150 (S205d). Furthermore, the controller 130 detects a read count nR, that is, information on a read count, in the selected memory block (S220d).

The selection of the memory block and the detection of the read count nR may be performed based on a read request received from the host 102 and an address (e.g., logical address or physical address) received along with the read request. Furthermore, the selection of the memory block and the detection of the read count nR may be one of periodic and aperiodic memory management operations performed under the control of the controller 130.

Furthermore, the read count nR of each of memory blocks included in the memory device 150 may be included in state information STATE_INF stored in the memory 144 which is used as the buffer/cache memory of the controller 130, and may be configured, managed and updated in the form of a table or list with respect to the memory block. To this end, the controller 130 may further include a read counter (not illustrated). The read count nR may be updated by the read counter (not illustrated). The controller 130 compares the detected read count nR with a set reference read count nR_TH (S230d). That is, the controller 130 determines whether the detected read count nR is greater than the reference read count nR_TH (S230d).

The controller 130 may set the reference read count nR_TH identically with a reference value of a WOL of data DAT (DWOL). If the number of bad blocks BB is insufficient, the controller 130 may set the reference number of bits (ED_TH) to be lower than a reference value of a WOL.

When, as a result of the determination at step S230d, the detected read count nR is greater than the reference read count nR_TH ('YES' in S230d), the controller 130 designates the memory block, having the read count nR detected at step S220d, as a bad block BB (S240d). In contrast, when, as a result of the determination at step S230d, the detected read count nR is less than or equal to the reference read count nR_TH ('NO' in S230d), the controller 130 does not designate the memory block, having the read count nR detected at step S220d, as a bad block BB.

The memory block designated as the bad block BB at step S240d is no longer used to store data. Accordingly, data reliability of the memory device 150 according to an embodiment of this disclosure can be improved.

The controller 130 may perform a fake operation on a bad block BB designated based on the method described with reference to FIGS. 6A and 6B. A fake operation according to an embodiment of this disclosure includes a memory operation performed on a bad block BB included in the memory device. The fake operation may include an erase operation, a read operation and/or a program operation. A fake operation according to an embodiment of this disclosure is performed so that a temperature of a memory device increases above a low temperature range. The controller 130 does not need to consider the results of the execution of the fake operation and the possibility that a bad block BB may be degraded because such block is no longer used to store data.

Hereinafter, a method of improving, by the memory system 110 according to another embodiment of this disclosure, data reliability is described with reference to FIGS. 2 to 5 and 7A to 7D. In particular, FIGS. 7A to 7D illustrate a method of performing, by the memory system 110 according to an embodiment of this disclosure, a BG operation.

A BG operation according to an embodiment of this disclosure may include wear leveling, a read reclaim, a garbage collection and/or map data management.

Figure 7A:
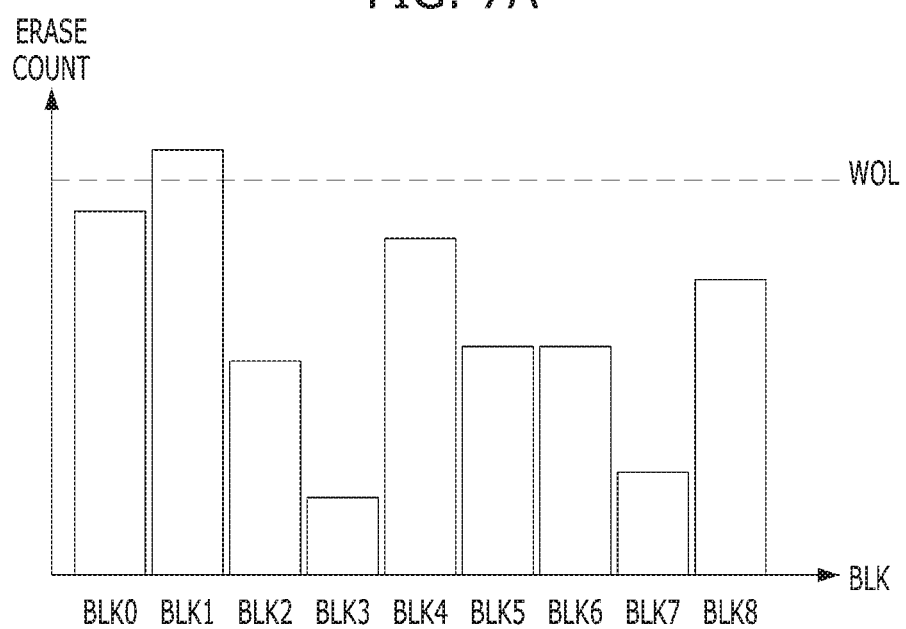
FIGS. 7A to 7D illustrate methods of performing a background operation by a memory system according to an embodiment of this disclosure.

FIG. 7A is a diagram for illustrating a wear leveling operation performed by the controller 130 according to an embodiment of this disclosure. In particular, the wear leveling operation may be performed by the FTL 40 illustrated in FIG. 5.

Wear leveling includes an operation of changing a storage location by copying data DAT, stored in a memory block having a relatively high erase count, to a memory block having a relatively low erase count.

In FIG. 7A, a horizontal axis indicates the numbers of the plurality of memory blocks BLK0 to BLK8 in the memory device 150. A vertical axis indicates an erase count, that is, the number of times that an erase operation has been performed on each of the plurality of memory blocks.

In the memory device 150, an erase operation is performed on each memory block. When an erase count reaches or exceeds a wear-out level WOL, the probability that an error may occur is increased when a program operation or read operation is performed on a corresponding memory block. Accordingly, the second memory block BLK1 having an erase count above a WOL is considered as a bad block BB and is not further used.

In this case, the lifespan of the memory device 150 can be effectively extended by moving data DAT stored in the first memory block BLK0, fifth memory block BLK4 and ninth memory block BLK8, having relatively high erase counts, to the fourth memory block BLK3 having a relatively low erase count, as shown in FIG. 7A. In this case, the first memory block BLK0, fifth memory block BLK4 and ninth memory block BLK8, that is, the subject of a wear leveling operation, may be called the source blocks (or victim blocks) of a BG operation. A memory device according to an embodiment of this disclosure can improve the reliability of the memory device by performing wear leveling so that data is not stored in a bad block BB, but is stored in a normal memory block.

A physical address of a physical block may be invalidated because a physical address, that is, the storage location of data corresponding to a logical block, is changed through wear leveling. In this case, as shown in FIG. 7D, the controller 130 can maintain a mapping table in the latest state by modifying the mapping table so that the changed physical address, not the invalidated physical address, is mapped to the logical address. Accordingly, the memory operation speed can be increased because a memory operation can be performed on the memory device according to an embodiment of this disclosure using a mapping table in the latest state through map data management.

The controller 130 according to an embodiment of this disclosure can improve reliability of the memory system 110 by differently setting an execution condition for wear leveling for the memory device 150 based on a current temperature of the memory device 150 so that a rise or fall in temperature of the memory device 150 is induced. This is described in detail with reference to FIGS. 9 to 11.

FIG. 7A is a diagram illustrating a read reclaim operation performed by the controller 130 according to an embodiment of this disclosure. In particular, the read reclaim operation may be performed by the FTL 40 illustrated in FIG. 5.

The read reclaim includes an operation of changing a storage location by copying data DAT, stored in a memory block having a relatively high read count, to another memory block for the safety of the data. If a read count is increased because data stored in a given block or given page is repeatedly read, the probability that an error may occur in the stored data may increase. For this reason, when a read count exceeds a set level, all data or only valid data of a corresponding block may be moved to another block.

Figure 7B:
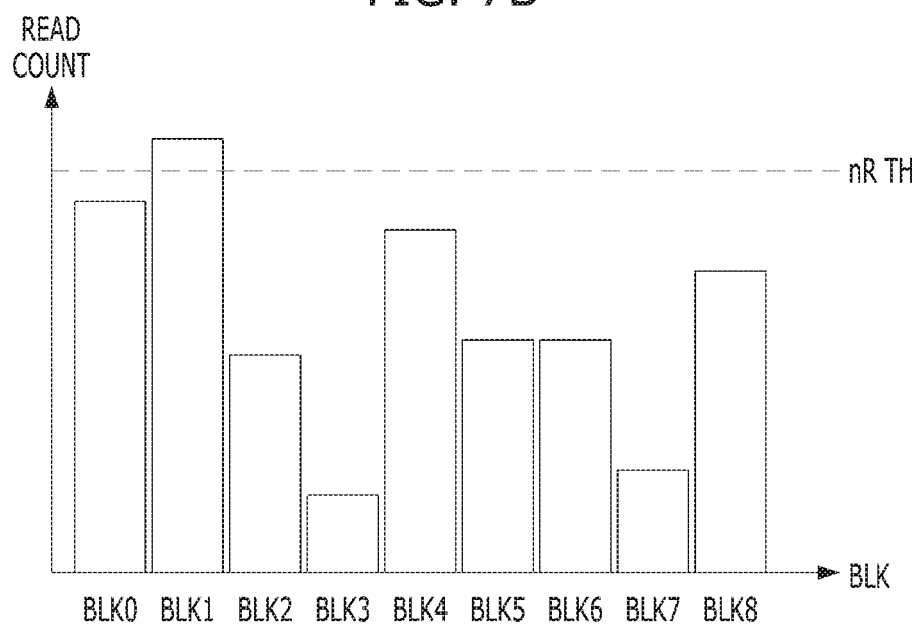

In FIG. 7B, a horizontal axis indicates the numbers of the plurality of memory blocks BLK0 to BLK8 included in the memory device 150. A vertical axis indicates a read count, that is, the number of times that a read operation has been performed on each of the plurality of memory blocks included in the memory device 150.

When a read count is at or above a set level, the probability that an error may occur in data stored in a corresponding memory block increases. Accordingly, the second memory block BLK1 having a read count at or above a set level is considered as a bad block BB and is not used.

In this case, the lifespan of the memory device 150 can be effectively extended by moving data DAT stored in the first memory block BLK0, fifth memory block BLK4 and ninth memory block BLK8 having relatively high read counts, to the fourth memory block BLK3 having a relatively low read count, as shown in FIG. 7B. In this case, the first memory block BLK0, the fifth memory block BLK4 and the ninth memory block BLK8, that is, the subject of a read reclaim operation, may be called the source blocks (or victim blocks) of a BG operation.

A memory device according to an embodiment of this disclosure can improve the reliability of the memory device by performing a read reclaim so that data is not stored in a bad block BB, but is stored in a normal memory block.

A physical address of a physical block may be invalidated because a physical address, that is, the storage location of data corresponding to a logical block, is changed through a read reclaim. In this case, as shown in FIG. 7D, the controller 130 can maintain a mapping table in the latest state by modifying the mapping table so that the changed physical address not the invalidated physical address is mapped to the logical address. Accordingly, the memory operation speed can be increased because a memory operation can be performed on the memory device according to an embodiment of this disclosure using a mapping table in the latest state through map data management.

The controller 130 according to an embodiment of this disclosure can improve the reliability of the memory system 110 by differently setting an execution condition for a read reclaim for the memory device 150 based on a current temperature of the memory device 150 so that a rise or fall in temperature of the memory device 150 is induced. This is described in detail with reference to FIGS. 9 to 11.

Figure 7C:
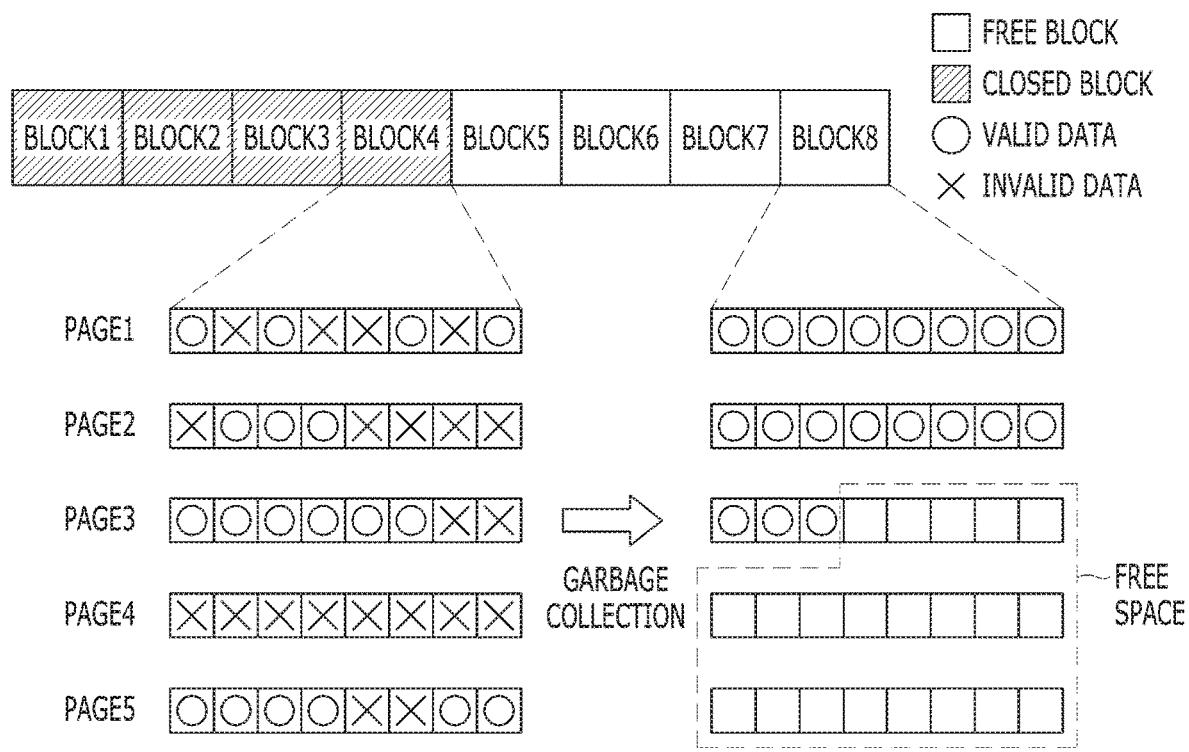
Figure 7D:
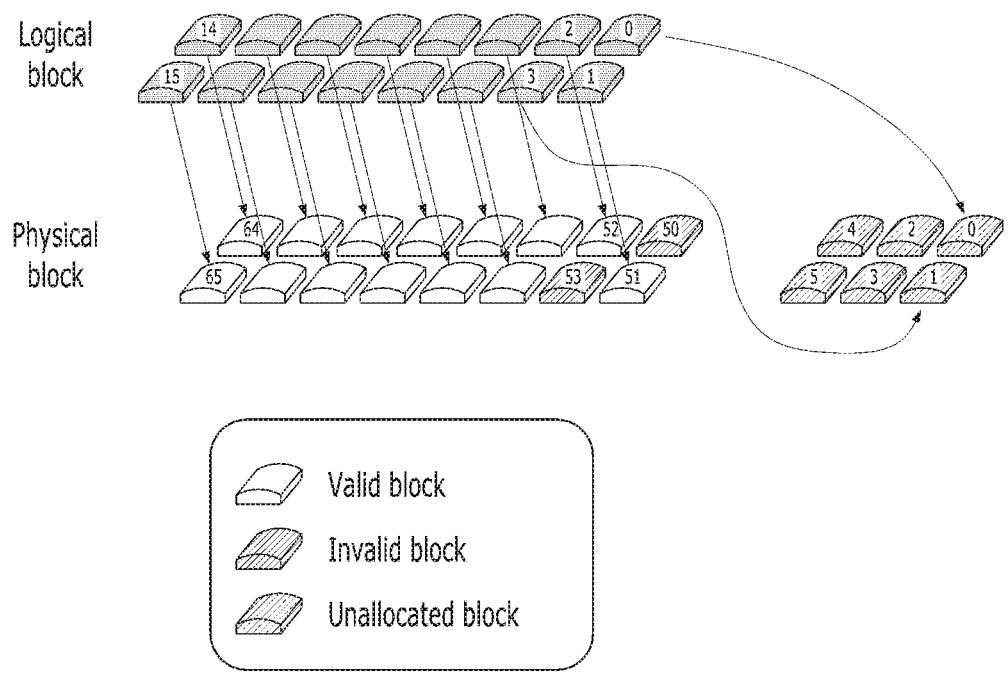

FIG. 7C is a diagram illustrating a garbage collection performed by the controller 130 according to an embodiment of this disclosure. In particular, the garbage collection may be performed by the FTL 40 illustrated in FIG. 5.

A garbage collection includes an operation of moving data, stored in a memory block in which valid data are scattered, to a free memory block and then erasing the corresponding memory block.

The memory device 150 illustrated in FIG. 7C includes first to eighth memory blocks BLK1 to BLK8, each of which includes first to fifth pages PAGE1 to PAGE5.

Referring to FIG. 7C, the first to fourth memory blocks BLK1 to BLK4 may be closed blocks in which data have been stored, and the fifth to eighth memory blocks BLK5 to BLK8 may be free blocks in which data have not been stored.

As shown in FIG. 7C, valid data and invalid data may have been scattered and stored in the first to fifth pages PAGE1 to PAGE5 of the fourth memory block BLK4.

In this case, the controller 130 can secure the fourth memory block BLK4 as a free block by copying the valid data, stored in the fourth memory block BLK4, to the eighth memory block BLK8, that is, a free block, and then performing an erase operation on the fourth memory block BLK4. Furthermore, the controller 130 can secure a space of the eighth memory block BLK8, remaining after storing the valid data of the fourth memory block BLK4, as a free space. In this case, the fourth memory block BLK4, that is, the subject of a garbage collection, may be called the source block (or victim block) of a BG operation. Furthermore, since the valid data of the fourth memory block BLK4 has been moved to the eighth memory block BLK8, the fourth memory block BLK4 can be made a free block by erasing all the data of the fourth memory block BLK4.

An operation of moving data, stored in a memory block in which valid data have been scattered, to a free block and then erasing the data of the memory block as described above may be called a garbage collection.

A memory device according to an embodiment of this disclosure can improve efficiency of the data storage of the memory device by performing a garbage collection to increase the number of free blocks.

A physical address of a physical block may be invalidated because a physical address, that is, the storage location of data corresponding to a logical block, is changed through a garbage collection. In this case, the controller 130 can maintain a mapping table in the latest state by modifying the mapping table so that the changed physical address, not the invalidated physical address, is mapped to the logical address, as shown in FIG. 7D. Accordingly, the memory device according to an embodiment of this disclosure can increase the memory operation speed by performing a memory operation using a mapping table in the latest state through map data management.

The controller 130 according to an embodiment of this disclosure can increase the reliability of the memory system 110 by differently setting an execution condition for a garbage collection for the memory device 150 based on a current temperature of the memory device 150 so that a rise or fall in temperature of the memory device 150 is induced. This is described in detail with reference to FIGS. 9 to 11.

FIG. 7D is a diagram illustrating a map data management method performed by the memory device of FIG. 2. The map data management includes an operation of maintaining a mapping table in the latest state by modifying the mapping table so that a changed physical address not an invalidated physical address is mapped to a logical address.

As shown in FIG. 7D, the memory system 110 may map a logical block of the host 102 and a physical block of the memory device 150 using a mapping table. In particular, map data management may be performed by the map data manager 44 included in the FTL 40 illustrated in FIG. 5.

A physical address of a physical block may be invalidated because a physical address, that is, the storage location of data corresponding to a logical block, is changed through wear leveling, a read reclaim or a garbage collection. In this case, as shown in FIG. 7D, the controller 130 can maintain a mapping table in the latest state by modifying the mapping table so that the changed physical address, not the invalidated physical address, is mapped to the logical address.

The memory operation speed can be increased because the memory device according to an embodiment of this disclosure can perform a memory operation using a mapping table in the latest state through map data management.

The controller 130 according to an embodiment of this disclosure can increase the reliability of the memory system 110 by differently setting an execution condition for map data management based on a current temperature of the memory device 150 so that a rise or fall in temperature of the memory device 150 is induced. This is described in detail with reference to FIGS. 9 to 11.

Figure 8:
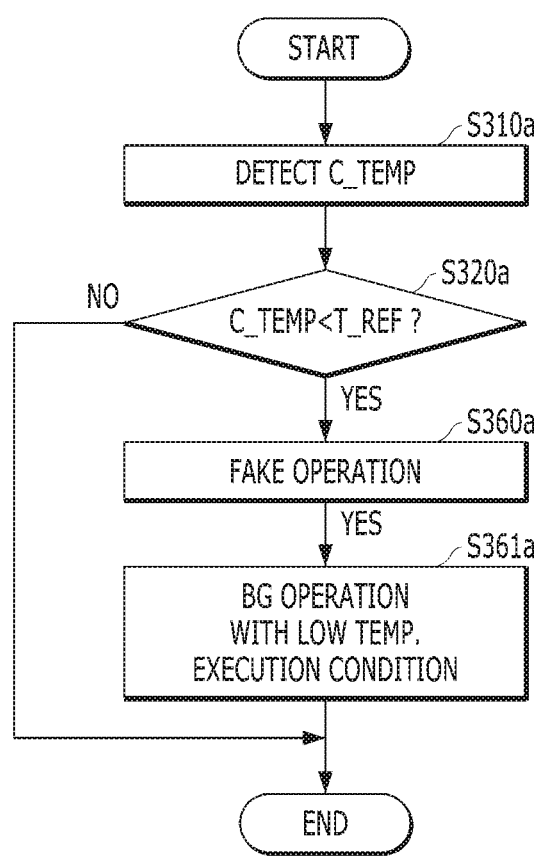
FIG. 8 is a diagram illustrating a method of performing an internal operation by a memory system according to an embodiment of this disclosure.

Hereinafter, a method of improving, by the memory system according to an embodiment of this disclosure, data reliability is described with reference to FIG. 8. In particular, FIG. 8 illustrates a method of controlling a temperature of a memory device by performing, by the memory system, a fake operation on a bad block BB or spare memory block that is not used to store data. In this fake operation, a process of writing, reading or erasing data with respect to a given block within the memory device is actually performed, but corresponding results do not need to be transmitted to the outside. The fake operation may include operations that do not need verification as to whether data has been normally written, read or erased. The fake operation illustrated in FIG. 8 may be performed by the memory system 110 and the memory device 150 illustrated in FIGS. 2 to 5. A bad block BB may be designated by the methods illustrated in FIGS. 6A and 6B.

Referring to FIGS. 2 to 5 and 8, the temperature sensor 335 may periodically detect a current temperature C_TEMP of the memory device 150 (S310a).

In an embodiment of this disclosure, the temperature sensor 335 may detect the current temperature C_TEMP under the control of the controller 130. Furthermore, the temperature sensor 335 may provide the detected current temperature C_TEMP to the controller 130.

Accordingly, the controller 130 determines a temperature range to which the current temperature C_TEMP belongs by comparing the current temperature C_TEMP with a reference temperature T_REF (S320a). The reference temperature T_REF may be set and stored in the controller 130. That is, the controller 130 determines whether the current temperature C_TEMP is lower than the reference temperature T_REF (S320a).

When, as a result of the determination at step S320a, the current temperature C_TEMP is not lower than the reference temperature T_REF ('NO' in S320a), the controller 130 may determine that the current temperature C_TEMP is higher than or equal to the reference temperature T_REF. In this case, the controller 130 may determine that an error does not occur when a program operation or read operation is performed on the memory device 150 because the temperature of the memory device 150 is not low.

When, as a result of the determination at step S320a, the current temperature C_TEMP is lower than the reference temperature T_REF ('YES' in S320a), the controller 130 may perform a fake operation on a bad block BB or spare memory block (S360a).

A fake operation according to an embodiment of this disclosure includes a memory operation performed on a memory block in a memory device and that is not used to store data, and may be performed under the control of the controller 130 without a request from the host. The fake operation may include an erase operation, a read operation and a program operation. A fake operation according to an embodiment of this disclosure is performed for the purpose of improving reliability by raising the temperature of the memory device 150 in a low temperature state. Furthermore, the controller 130 may not consider the results of the execution of the fake operation and the possibility that a bad block BB or spare memory block may be degraded because such block is no longer used to store data. Furthermore, the fake operation performed at step S360a may be performed in the idle state of the memory system 110. The fake operation may be performed during the idle state in which there is a high possibility that the state of the memory system 110 may become a low temperature state. Furthermore, the fake operation may be performed when the state of the memory system 110 is a low temperature state even when the memory system 110 is not idle but rather is in a normal state in which the memory system performs a normal operation. In this case, a block operation may be performed within a range that does not hinder the normal operation of the memory system 110.

Furthermore, when the current temperature C_TEMP is lower than the reference temperature T_REF ('YES' in S320a), the controller 130 may perform a BG operation according to a low temperature execution condition (S361a), as described with reference to FIG. 1. The BG operation may include a garbage collection, wear leveling and/or a read reclaim. The low temperature execution condition may indicate that the BG operation be performed more frequently, on more memory blocks and for a longer period of time than indicated by a non-low temperature execution condition. Accordingly, when the current temperature C_TEMP is lower than the reference temperature T_REF, the amount of heat generated from the memory system 110 may increase as a result of the BG operation being further performed according to the low temperature execution condition.

That is, the method of controlling, by the memory system 110, a current temperature C_TEMP, which is illustrated in FIG. 8, may include the step S310a of detecting the current temperature C_TEMP of the memory device 150 and the step S360a of performing a fake operation on a select memory block (e.g., a bad block BB or spare memory block) that is not used to store data when the detected current temperature C_TEMP of the memory device 150 is within a low temperature range ('YES' in S320a). The fake operation may include a program operation, an erase operation and/or a read operation. Furthermore, the method may further include the step S361a of performing a BG operation by changing an execution condition for the BG operation performed on a memory block based on the current temperature C_TEMP detected at step S310a. The step S361a of performing a BG operation by changing an execution condition for the BG operation may be performed prior to the step S360a of performing a fake operation. Furthermore, the step S361a of performing a BG operation by changing an execution condition for the BG operation may be performed after the step S360a of performing a fake operation. The execution condition for a BG operation may include an execution time, an amount of an execution target memory block and/or an execution period.

Figure 10A:
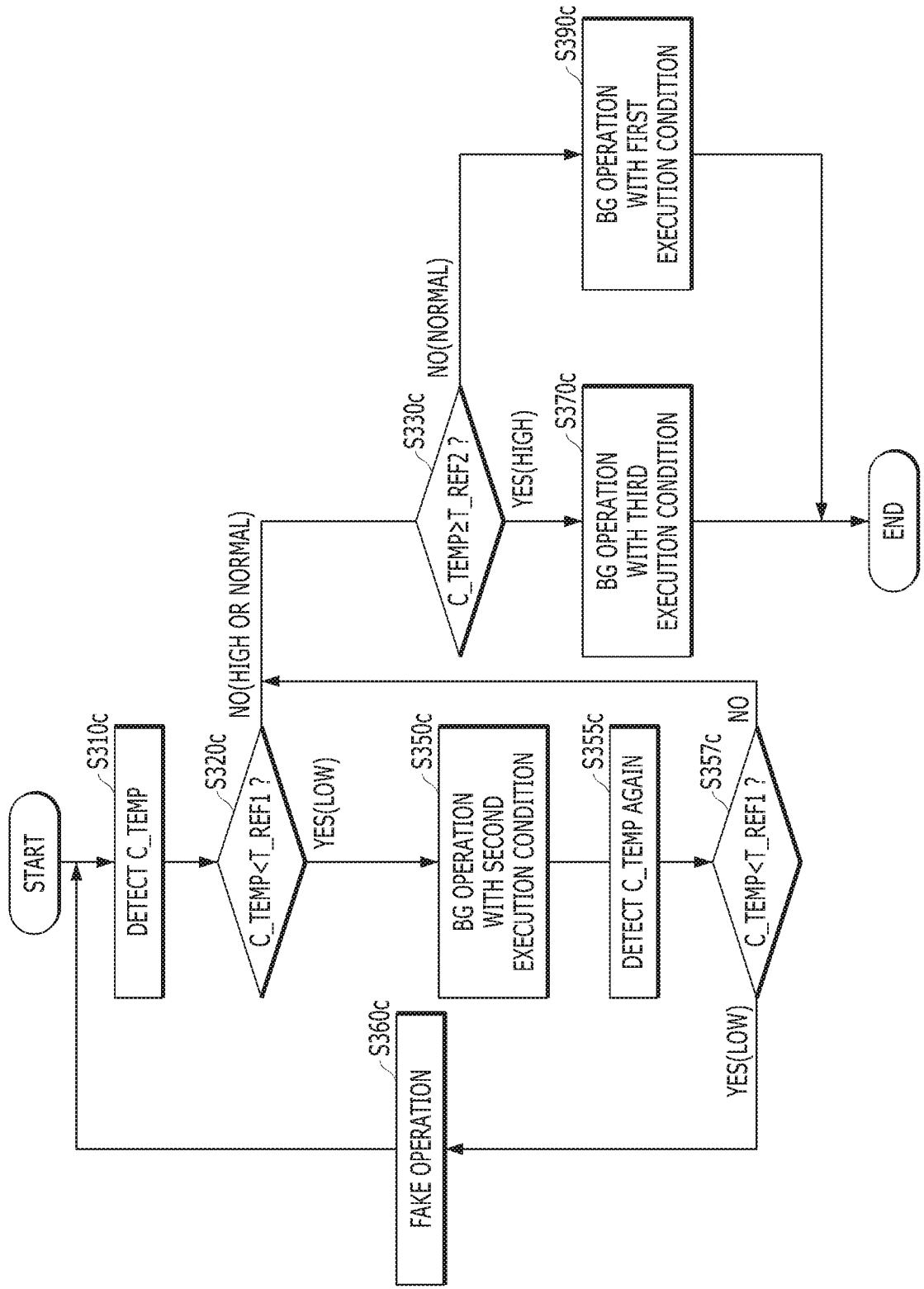
FIGS. 10A and 10B are illustrating methods of performing an internal operation by a memory system according to still another embodiment of this disclosure.
Figure 10B:
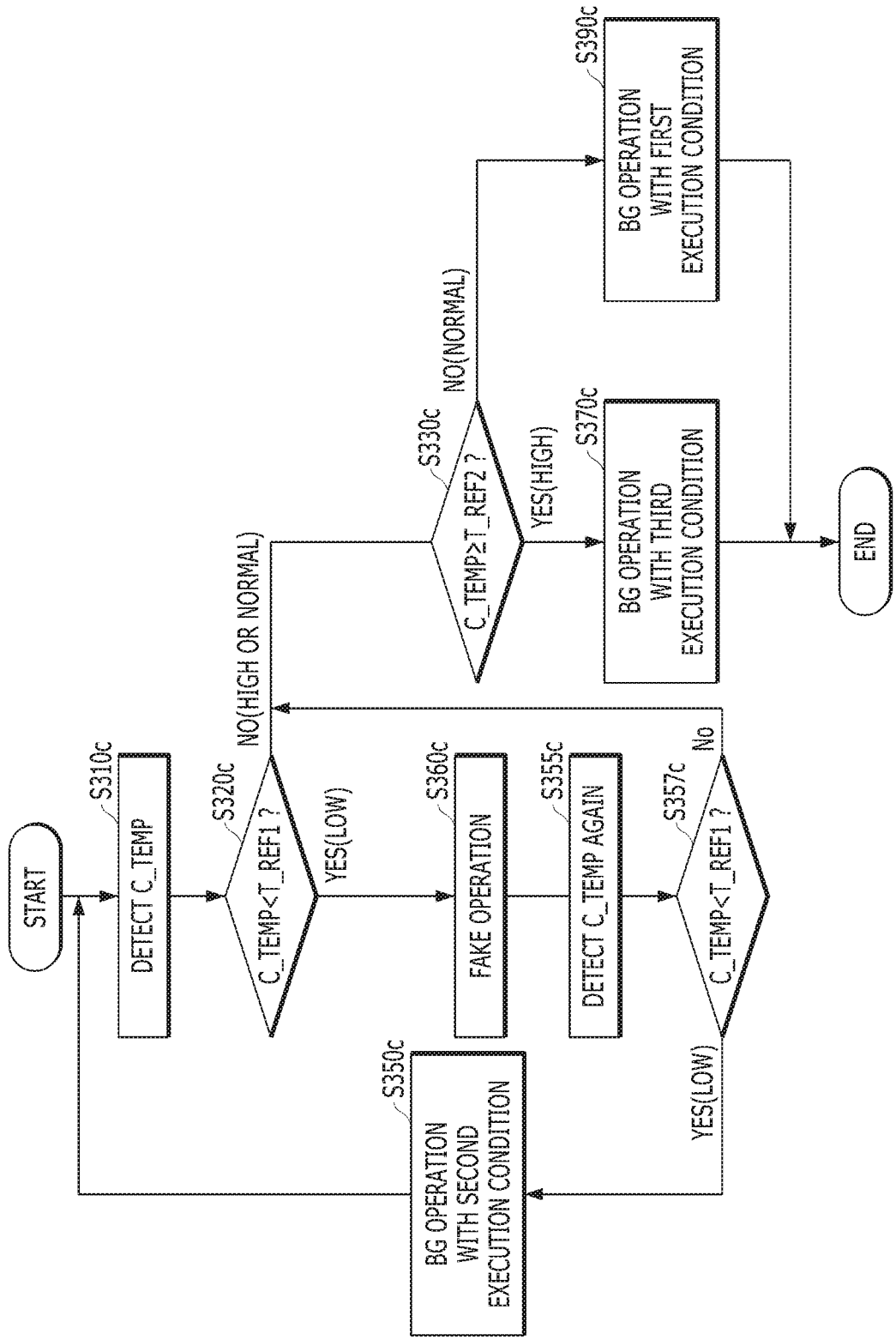

FIGS. 9, 10A and 10B illustrate methods of controlling, by the memory system, a temperature of a memory device by differently setting an execution condition for an internal operation performed in the memory device based on a current temperature of the memory device.

The internal operation may include a fake operation and a background (BG) operation performed on a bad block BB or spare memory block. The fake operation may include program, read and/or erase operations. Furthermore, the BG operation may include a garbage collection, wear leveling, a read reclaim, and/or map data management, as described with reference to FIGS. 7A to 7D.

The execution condition may include the execution time, execution target memory block and execution period of an internal operation. The execution time, execution target memory block and execution period of an internal operation are factors for controlling frequency at which the internal operation is performed and the execution time of the internal operation, but this invention is not limited to these specific factors. Furthermore, the amount of heat generated from a memory device may be controlled by controlling frequency at which an internal operation is performed and the execution time of the internal operation. Eventually, the temperature of the memory device can be controlled.

FIG. 9 illustrates a method of controlling, by the memory system 110, the temperature of a memory device by performing a BG operation. FIGS. 10A and 10B illustrate methods of controlling, by the memory system 110, the temperature of a memory device by performing a BG operation or fake operation, and also controlling the temperature of the memory device by additionally performing a fake operation or BG operation when the state of the memory device is a low temperature state.

Hereinafter, a method of controlling, by the memory system 110, the temperature of a memory device by performing a BG operation is described with reference to FIG. 9.

Referring to FIG. 9, the temperature sensor 335 may periodically detect a current temperature C_TEMP of the memory device 150 (S310b).

In an embodiment of this disclosure, the temperature sensor 335 may detect the current temperature C_TEMP under the control of the controller 130. Furthermore, the temperature sensor 335 may provide the detected current temperature C_TEMP to the controller 130.

Accordingly, the controller 130 may determine a temperature range to which the current temperature C_TEMP belongs by comparing the current temperature C_TEMP with a first reference temperature T_REF1 and a second reference temperature T_REF2. The first reference temperature T_REF1 and the second reference temperature T_REF2 may be set and stored in the controller 130. The controller 130 determines whether the current temperature C_TEMP is lower than the first reference temperature T_REF1 (S320b).

When, as a result of the determination at step S320b, the current temperature C_TEMP is lower than the first reference temperature T_REF1 ('YES' in S320b), the controller 130 determines that the current temperature C_TEMP of the memory device 150 is in a low temperature range. When the current temperature C_TEMP is in the low temperature range, the controller 130 may determine that an error occurs when a program operation or read operation is performed on the memory device 150 because the current temperature of the memory device 150 is low. In this case, the controller 130 may perform a BG operation according to a second execution condition on a source block (or victim block) that requires a BG operation under the control of the controller 130 (S350b).

When, as a result of the determination at step S320b, the current temperature C_TEMP is not lower than the first reference temperature T_REF1 ('NO' in S320b), the controller 130 determines that the current temperature C_TEMP of the memory device 150 is in a high temperature range or normal temperature range. Accordingly, the controller 130 determines whether the current temperature C_TEMP is higher than the second reference temperature T_REF2 (S330b).

When, as a result of the determination at step S330b, the current temperature C_TEMP is higher than the second reference temperature T_REF2 ('YES' in S330b), the controller 130 determines that the current temperature C_TEMP of the memory device 150 is in a high temperature range. When the current temperature C_TEMP is in the high temperature range, the controller 130 may determine that an error occurs when a program operation or read operation is performed on the memory device 150 because the current temperature of the memory device 150 is high. In this case, the controller 130 may perform a BG operation according to a third execution condition on a source block (or victim block) that requires a BG operation under the control of the controller 130 (S370b).

When, as a result of the determination at step S330b, the current temperature C_TEMP is between the first reference temperature T_REF1 and the second reference temperature T_REF2, the controller 130 determines that the current temperature C_TEMP of the memory device 150 is in a normal temperature range. When the current temperature C_TEMP is in the normal temperature range, the controller 130 may determine that an error does not occur when a program operation or read operation is performed on the memory device 150 because the current temperature of the memory device 150 is appropriate. In this case, the controller 130 may perform a BG operation according to a first execution condition on a source block (or victim block) that requires a BG operation (S390b).

Hereinafter, a method of setting the execution condition for a BG operation (e.g., garbage collection) performed in each of steps S350b, S370b and S390b based on the current temperature C_TEMP detected at step S310b of FIG. 9 is described.

When the current temperature C_TEMP detected at step S310b is in the normal temperature range, the controller 130 may perform a garbage collection according to the first execution condition.

The first execution condition may include the execution time (e.g., when the number of free blocks nFB is N or less) of a garbage collection. Furthermore, the first execution condition may include the execution target (e.g., a memory block in which the number of invalid pages nIP is M or more) of a garbage collection. Furthermore, the first execution condition may include both the execution time and the execution target. That is, when the number of free blocks nFB is N or less, a garbage collection may be performed on a memory block in which the number of invalid pages nIP is M or more.

For example, when the current temperature C_TEMP is included in the normal temperature range, the controller 130 may perform a garbage collection on a memory block in which the number of invalid pages nIP is 50 or more when the number of free blocks nFB is 100.

Furthermore, the first execution condition may include a first execution period, that is, the execution period of a garbage collection. That is, the controller 130 may perform a garbage collection for each first execution period regardless of an execution time and an amount of execution target memory blocks.

When the current temperature C_TEMP detected at step S310b is in the low temperature range, the controller 130 may perform a garbage collection according to the second execution condition. In the low temperature range, the second execution condition may be less stringent than the first execution condition in order to increase frequency at which a garbage collection is performed and the execution time of the garbage collection compared to the normal temperature range (first) execution condition.

The second execution condition may include the execution time (e.g., when the number of free blocks nFB is K or less, which is less than N) of a garbage collection. Furthermore, the second execution condition may include the execution target (e.g., a memory block in which the number of invalid pages nIP is P or more, which is less than M) of a garbage collection. Furthermore, the second execution condition may include both the execution time and the execution target. That is, when the number of free blocks nFB is K or less, a garbage collection may be performed on a memory block in which the number of invalid pages nIP is P or more.

For example, when the current temperature C_TEMP is in the low temperature range, the controller 130 may perform a garbage collection although the garbage collection does not need to be performed because the number of free blocks nFB is 200, and may perform a garbage collection even on a memory block in which the number of invalid pages nIP is merely 10.

Furthermore, the second execution condition may include a second execution period shorter than the first execution period. That is, the controller 130 may perform a garbage collection for each second execution period regardless of an execution time and an amount of an execution target which may include the number of target memory blocks.

The execution time of an internal operation according to the second execution condition in the low temperature range may be set so that the internal operation is performed more frequently compared to the execution time of an internal operation according to the first execution condition. Accordingly, frequency at which the internal operation is performed in the low temperature range may be higher than that in the normal temperature range. Furthermore, the number of execution targets of an internal operation according to the second execution condition may be set to be greater than the number of execution targets of an internal operation according to the first execution condition. Accordingly, the execution time of the internal operation in the low temperature range may be longer than that in the normal temperature range. Furthermore, the execution period of an internal operation according to the second execution condition may be set to be shorter than the execution period of an internal operation according to the first execution condition. Accordingly, frequency at which the internal operation is performed in the high temperature range may be higher than that in the normal temperature range. In conclusion, the amount of heat generated from a memory device in the low temperature range may be greater than the amount of heat generated from a memory device in the normal temperature range due to the execution time of an internal operation and frequency at which the internal operation is performed in the low temperature range. Accordingly, the temperature of the memory device in the low temperature range may gradually rise.

As described above, the second execution condition in the low temperature range increases frequency at which a garbage collection is performed and the execution time of the garbage collection compared to the first execution condition in the normal temperature range. Accordingly, the temperature of the memory system 110 according to an embodiment of this disclosure may rise from the low temperature range to the normal temperature range. As described above, this disclosure can provide an effect in that it can improve the reliability of a memory device by changing an execution condition, including the execution time, execution target memory block and execution period of a BG operation, based on a current temperature C_TEMP.

When the current temperature C_TEMP detected at step S310b is in the high temperature range, the controller 130 may perform a garbage collection according to the third execution condition. In the high temperature range, the third execution condition may be more relaxed than the first execution condition in order to reduce frequency that a garbage collection is performed and the execution time of the garbage collection compared to the normal temperature range.

The third execution condition may include the execution time (e.g., when the number of free blocks nFB is B or less, which is less than N) of a garbage collection. Furthermore, the third execution condition may include an amount of an execution target (e.g., a memory block in which the number of invalid pages nIP is G or more, which is greater than M) of a garbage collection. Furthermore, the third execution condition may include both the execution time and the execution target. That is, when the number of free blocks nFB is B or less, a garbage collection may be performed on a memory block in which the number of invalid pages nIP is G or more.

For example, even though there are only 10 free blocks nFB, the controller 130 may not perform garbage collection when the current temperature C_TEMP is in the high temperature range. Also, the controller 130 may not perform garbage collection on a memory block that has almost no valid page.

Furthermore, there are only 10 free blocks nFB, the controller 130 may not perform garbage collection when the current temperature C_TEMP is in the high temperature range, the third execution condition may include a third execution period longer than the first execution period. That is, the controller 130 may perform a garbage collection for each third execution period regardless of an execution time and an amount of an execution target.

The execution time of an internal operation according to the third execution condition may be set so that the internal operation is performed less frequently compared to the execution time of an internal operation according to the first execution condition. Accordingly, frequency at which an internal operation is performed in the high temperature range may be lower than that in the normal temperature range. Furthermore, the number of the execution targets of an internal operation according to the third execution condition may be set to be less than the number of the execution targets of an internal operation according to the first execution condition. Accordingly, the execution time of an internal operation in the low temperature range may be shorter than that in the normal temperature range. Furthermore, the execution period of an internal operation according to the third execution condition may be set to be longer than the execution period of an internal operation according to the first execution condition. Accordingly, frequency at which an internal operation is performed in the high temperature range may be lower than that in the normal temperature range. In conclusion, the amount of heat generated from a memory device in the high temperature range may be less than the amount of heat generated from a memory device in the normal temperature range due to the execution time of an internal operation and frequency at which the internal operation is performed in the high temperature range. Accordingly, the temperature of the memory device in the high temperature range may gradually fall.

Furthermore, the method of controlling the temperature of the memory system 110 according to an embodiment of this disclosure, which is illustrated in FIG. 9, may include the steps of performing a low temperature BG operation according to a low temperature execution condition when the current temperature C_TEMP of the memory device 150 is in a low temperature range, performing a normal BG operation according to a normal execution condition when the current temperature C_TEMP is in a normal temperature range, and performing a high temperature BG operation according to a high temperature execution condition when the current temperature C_TEMP is in a high temperature range. The low temperature execution condition may have the number of execution targets greater and an execution period shorter than those of the normal execution condition. The high temperature execution condition may have the number of execution targets smaller and an execution period longer than those of the normal execution condition. The number of execution targets and execution time of a BG operation according to the low temperature execution condition may be greater and longer than the number of execution targets and execution time of a BG operation according to the normal execution condition. The number of execution targets and execution time of a BG operation according to the high temperature execution condition may be less and shorter than the number of execution targets and execution time of a BG operation according to the normal execution condition. The amount of heat generated in a BG operation according to the low temperature execution condition may be greater than the amount of heat generated in a BG operation according to the normal execution condition. The amount of heat generated in a BG operation according to the high temperature execution condition may be less than the amount of heat generated in a BG operation according to the normal execution condition.

A normal BG operation may include a garbage collection performed when the number of free blocks is N or less. A low temperature BG operation may include a garbage collection performed when the number of free blocks is K or less, which is less than N. A high temperature BG operation may include a garbage collection performed when the number of free blocks is B or less, which is greater than N. Furthermore, a normal BG operation may include wear leveling or a read reclaim performed on memory blocks having an erase count of N or more. A low temperature BG operation may include wear leveling or a read reclaim performed on memory blocks having an erase count of K or more, which is less than N. A high temperature BG operation may include wear leveling or a read reclaim performed on memory blocks having an erase count of B or more, which is greater than N.

As described above, in the third execution condition in the high temperature range, the execution time, frequency that an internal operation is performed, execution target and execution time of a BG operation are reduced compared to the first execution condition in the normal temperature range. Accordingly, the temperature of the memory system 110 may drop from being in the high temperature range to being in the normal temperature range. As described above, this disclosure improves the reliability of a memory device by changing an execution condition, including the execution time, execution target and execution period of a BG operation, based on a current temperature C_TEMP.

Hereinafter, a method of controlling, by the memory system 110, the temperature of a memory device by performing a BG operation and a fake operation is described with reference to FIG. 10A. In particular, FIG. 10A illustrates a method of controlling, by the memory system 110, the temperature of a memory device by performing a BG operation, and also controlling the temperature of the memory device by additionally performing a fake operation when the memory device is in a low temperature state.

Referring to FIG. 10A, the temperature sensor 335 may periodically detect a current temperature C_TEMP of the memory device 150 (S310c).

In an embodiment of this disclosure, the temperature sensor 335 may detect the current temperature C_TEMP under the control of the controller 130. Furthermore, the temperature sensor 335 may provide the detected current temperature C_TEMP to the controller 130.

Accordingly, the controller 130 may determine a temperature range to which the current temperature C_TEMP belongs by comparing the current temperature C_TEMP with a first reference temperature T_REF1 and a second reference temperature T_REF2. The first reference temperature T_REF1 and the second reference temperature T_REF2 may be pre-defined and stored in the controller 130. The controller 130 determines whether the current temperature C_TEMP is lower than the first reference temperature T_REF1 (S320c).

When, as a result of the determination at step S320c, the current temperature C_TEMP is lower than the first reference temperature T_REF1 ('YES' in S320c), the controller 130 determines that the current temperature C_TEMP of the memory device 150 is in a low temperature range. When the current temperature C_TEMP is in the low temperature range, the controller 130 may determine that an error occurs when a program operation or read operation is performed on the memory device 150 because the current temperature of the memory device 150 is low. In this case, the controller 130 may perform a BG operation according to a second execution condition on a source block (or victim block) that requires a BG operation under the control of the controller 130 (S350c).

Thereafter, the controller 130 detects a current temperature C_TEMP of the memory device 150 again (S355c). The controller 130 determines whether the current temperature C_TEMP detected at step S355c is lower than the first reference temperature T_REF1 (S357c).

When, as a result of the determination at step S357c, the current temperature C_TEMP is lower than the first reference temperature T_REF1 ('YES' in S357c), the controller 130 determines that the current temperature C_TEMP of the memory device 150 is still in the low temperature range. Accordingly, the controller 130 additionally performs a fake operation on a bad block BB or spare memory block (S360c).

When, as a result of the determination at step S357c, the current temperature C_TEMP is not lower than the first reference temperature T_REF1 ('NO' in S357c), the controller 130 determines that the current temperature C_TEMP of the memory device 150 has deviated from the low temperature range by the BG operation according to the second execution condition performed at step S350c. However, in preparation for a case in which the current temperature C_TEMP of the memory device 150 is in a high temperature range as a result of the BG operation performed at step S350c, the controller 130 determines whether the current temperature C_TEMP is higher than the second reference temperature T_REF2 (S330c).

When, as a result of the determination at step S320c, the current temperature C_TEMP is not lower than the first reference temperature T_REF1 ('NO' in S320c), the controller 130 determines that the current temperature C_TEMP of the memory device 150 is in a high temperature range or a normal temperature range. Accordingly, the controller 130 determines whether the current temperature C_TEMP is higher than the second reference temperature T_REF2 (S330c).

When, as a result of the determination at step S330c, the current temperature C_TEMP is higher than the second reference temperature T_REF2 ('YES' in S330c), the controller 130 determines that the current temperature C_TEMP of the memory device 150 is in the high temperature range. If the current temperature C_TEMP is in the high temperature range, the controller 130 may determine that an error occurs when a program operation or read operation is performed on the memory device 150 because the current temperature of the memory device 150 is high. In this case, the controller 130 may perform a BG operation according to a third execution condition on a source block (or victim block) that requires a BG operation (S370c).

When, as a result of the determination at step S330c, the current temperature C_TEMP is between the first reference temperature T_REF1 and the second reference temperature T_REF2, the controller 130 determines that the current temperature C_TEMP of the memory device 150 is in the normal temperature range. When the current temperature C_TEMP is in the normal temperature range, the controller 130 may determine that an error does not occur when a program operation or read operation is performed on the memory device 150 because the current temperature of the memory device 150 is appropriate. In this case, the controller 130 may perform a BG operation according to a first execution condition on a source block (or victim block) that requires a BG operation (S390c).

The execution conditions for the BG operation performed at each of steps S350c, S370c and S390c based on the current temperature C_TEMP detected at step S310c have already been described with reference to FIG. 9.

FIG. 10B illustrates a method of controlling, by the memory system 110, the temperature of a memory device by performing a fake operation, and also controlling the temperature of the memory device by additionally performing a BG operation when the state of the memory device is a low temperature state. Only a technical difference between FIGS. 10A and 10B is described with reference to FIG. 10B. In short, in the method of FIG. 10B, steps S350c and 360c are switched relative to their locations in the flow chart of FIG. 10A.

When, as a result of the determination at step S320c, the current temperature C_TEMP is lower than a first reference temperature T_REF1 ('YES' in S320c), the controller 130 determines that the current temperature C_TEMP of the memory device 150 is in a low temperature range. When the current temperature C_TEMP is in the low temperature range, the controller 130 may determine that an error occurs when a program operation or read operation is performed on the memory device 150 because the current temperature of the memory device 150 is low. In this case, the controller 130 performs a fake operation on a bad block BB or spare memory block (S360c).

Thereafter, the controller 130 detects a current temperature C_TEMP of the memory device 150 again (S355c). The controller 130 determines whether the current temperature C_TEMP detected at step S355c is lower than the first reference temperature T_REF1 (S357c).

When, as a result of the determination at step S357c, the current temperature C_TEMP is lower than the first reference temperature T_REF1 ('YES' in S357c), the controller 130 determines that the current temperature C_TEMP of the memory device 150 is still in the low temperature range. Accordingly, the controller 130 may additionally perform a BG operation according to a second execution condition on a source block (or victim block) that requires a BG operation (S350c).

As described above, embodiments of this disclosure illustrated in FIGS. 10A and 10B can improve the reliability of the memory system 110 by changing an execution condition, including the execution time and execution target of a BG operation, based on a current temperature C_TEMP.

Furthermore, in the low temperature state, the temperature of the memory system 110 illustrated in FIGS. 10A and 10B may become higher than the temperature of the memory system 110 illustrated in FIG. 9, and may quickly rise from the low temperature range to bring the memory system 110 to the normal state with a temperature in the normal range. Accordingly, the reliability of the memory system 110 illustrated in FIGS. 10A and 10B is further improved.

As described above, data reliability and data storage efficiency of the memory device 150 can be improved based on the different embodiments described with reference to FIGS. 1, 8 to 10A and 10B.

To this end, the memory system 110 according to an embodiment of this disclosure differently sets an execution condition for an internal operation based on a current temperature of the memory device 150, and performs the internal operation so that the temperature of the memory device 150 is induced to rise or fall, and thus the temperature of the memory device can maintain a normal temperature range. Accordingly, the memory system 110 according to an embodiment of this disclosure can effectively prevent a malfunction of the memory device and the occurrence of an error in data of the memory device and improve the reliability of storage data.

In the memory system and method of driving the same according to an embodiment of this disclosure, when the temperature of the memory device is included in a low temperature range or high temperature range, the temperature of a memory cell array is induced to rise or fall respectively through control of an internal operation including a BG operation or a fake operation having less influence on data safety. Accordingly, performance, data reliability and data storage efficiency of the memory device can be improved.

In the memory system and method of driving the same according to an embodiment of this disclosure, an execution condition for an internal operation is differently set based on a temperature of the memory device so that the temperature of the memory device maintains a normal temperature range. Accordingly, the memory system according to an embodiment of this disclosure can prevent input and output performance, data reliability and data storage efficiency of the memory device from being degraded.

In the memory system and method of driving the same according to an embodiment of this disclosure, when a temperature of the memory device is included in a low temperature range, an internal operation is additionally performed, or advanced and performed so that the temperature of the memory device is raised and thus the temperature of the memory device maintains a normal temperature range. Accordingly, the memory system according to an embodiment of this disclosure can effectively improve performance, data reliability and data storage efficiency of the memory device.

In the memory system according to an embodiment of this disclosure, the operation safety of the memory system may be maintained because an internal temperature can be autonomously controlled even in an environment in which a surrounding temperature may rise, such as a data center in which a large amount of data can be stored and processed or an environment in which the temperature may change, such as a vehicle.

Although various embodiments have been illustrated and described in detail, this disclosure may be modified in various ways without departing from the scope of this invention. Accordingly, the scope of this invention should not be limited to the above-described embodiments, but should be defined by not only the claims, but equivalents thereof.

What is claimed is:

1. A memory system comprising:
   a memory device comprising a plurality of memory blocks; and
   a controller suitable for controlling an operation of the memory device,
   wherein the controller performs a fake operation on a bad block that is determined to be no longer used to store data when a temperature of the memory device is in a low temperature range.

2. The memory system of claim 1, wherein the fake operation comprises a program operation, an erase operation or a read operation.

3. The memory system of claim 1, further comprising a temperature sensor suitable for detecting the temperature of the memory device.

4. The memory system of claim 1, wherein the controller performs a background operation according to an execution condition for the background operation based on the temperature of the memory device.

5. The memory system of claim 4, wherein the background operation comprises at least one of a garbage collection, wear leveling and a read reclaim.

6. The memory system of claim 4, wherein the execution condition for the background operation comprises an execution time, a number of execution targets in the set memory block and an execution period.

7. The memory system of claim 4,
wherein the controller performs a first background operation according to a first execution condition when the temperature is in a normal temperature range,
performs a second background operation according to a second execution condition when the temperature is in the low temperature range, and
performs a third background operation according to a third execution condition when the temperature is in a high temperature range.

8. The memory system of claim 7, wherein the second execution condition has more execution targets and a shorter execution period than the first execution condition.

9. The memory system of claim 7, wherein the third execution condition has fewer execution targets and a longer execution period than the first execution condition.

10. A method of controlling a temperature, by a memory system, the memory system comprising a memory device including a plurality of memory blocks and a controller suitable for controlling the memory device, and the method comprising:
detecting a temperature of the memory device; and
performing a fake operation on a bad block that is determined to be no longer used to store data when the detected temperature of the memory device is in a low temperature range.

11. The method of claim 10, wherein the fake operation comprises a program operation, an erase operation or a read operation.

12. The method of claim 10, further comprising performing a background operation according to an execution condition for the background operation performed on a memory block based on the detected temperature.

13. The method of claim 12, wherein the performing of the background operation is performed prior to the performing of the fake operation.

14. The method of claim 12, wherein the performing of the background operation is performed after the performing of the fake operation.

15. The method of claim 12, wherein the background operation comprises at least one of a garbage collection, wear leveling and a read reclaim.

16. The method of claim 12, wherein the execution condition comprises an execution time, a number of execution targets in the set memory block and an execution period.

17. The method of claim 16, further comprising:
performing a first background operation according to a first execution condition when the temperature is in a normal temperature range;
performing a second background operation according to a second execution condition when the temperature is in the low temperature range; and
performing a background operation according to a third execution condition when the temperature is in a high temperature range.

18. The method of claim 17, wherein:
the second execution condition has more execution targets and a longer execution time than the first execution condition, and
the third execution condition has fewer execution targets and a shorter execution time than the first execution condition.

19. A memory system comprising:
a memory device comprising a plurality of memory blocks; and
a controller suitable for controlling an operation of the memory device,
wherein the controller performs a fake operation on a set memory block not used to store data when a temperature of the memory device is in a low temperature range,
wherein the controller performs a first background operation according to a first execution condition when the temperature is in a normal temperature range, performs a second background operation according to a second execution condition when the temperature is in the low temperature range, and performs a third background operation according to a third execution condition when the temperature is in a high temperature range, and
wherein the second execution condition has more execution targets and a shorter execution period than the first execution condition.

20. A memory system comprising:
a memory device comprising a plurality of memory blocks; and
a controller suitable for controlling an operation of the memory device,
wherein the controller performs a fake operation on a set memory block not used to store data when a temperature of the memory device is in a low temperature range,
wherein the controller performs a first background operation according to a first execution condition when the temperature is in a normal temperature range, performs a second background operation according to a second execution condition when the temperature is in the low temperature range, and performs a third background operation according to a third execution condition when the temperature is in a high temperature range, and
wherein the third execution condition has fewer execution targets and a longer execution period than the first execution condition.

* * * * *